(12) United States Patent
Liu et al.

(10) Patent No.: US 12,738,411 B2
(45) Date of Patent: Sep. 15, 2026

(54) INDUCTOR PACKAGES EMPLOYING WIRE BONDS OVER A LEAD FRAME TO FORM INTEGRATED INDUCTOR(S), AND RELATED INTEGRATED CIRCUIT (IC) PACKAGES AND FABRICATION METHODS

(71) Applicant: QUALCOMM Incorporated, San Diego, CA (US)

(72) Inventors: Kai Liu, Phoenix, AZ (US); Jui-Yi Chiu, Taichung City (TW); Nosun Park, San Diego, CA (US); Je-Hsiung Lan, San Diego, CA (US); Jonghae Kim, San Diego, CA (US); Periannan Chidambaram, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 958 days.

(21) Appl. No.: 17/815,784

(22) Filed: Jul. 28, 2022

(65) Prior Publication Data

US 2024/0038439 A1 Feb. 1, 2024

(51) Int. Cl.
*H01F 27/28* (2006.01)
*H01F 41/064* (2016.01)
(Continued)

(52) U.S. Cl.
CPC ....... *H01F 27/2866* (2013.01); *H01F 41/064* (2016.01); *H10D 1/20* (2025.01);
(Continued)

(58) Field of Classification Search
CPC .... H01F 27/2866; H01F 41/064; H01F 27/24; H01F 41/04; H01F 2017/048;
(Continued)

(56) References Cited

U.S. PATENT DOCUMENTS 4,847,986 A * 7/1989 Meinel ................ H01F 17/0033
29/606
6,051,890 A * 4/2000 Mozdzen ................ H01L 24/49
257/784

(Continued)

FOREIGN PATENT DOCUMENTS

JP H08162329 A 6/1996

OTHER PUBLICATIONS

Bellaredj, M.L.F. et al., "Design, Fabrication, and Characterization of Package Embedded Solenoidal Magnetic Core Inductors for High-Efficiency System-In-Package Integrated Voltage Regulators," IEEE Transactions on Magnetics, vol. 55, No. 7, Jul. 2019, IEEE, 7 pages.

(Continued)

*Primary Examiner* — Mang Tin Bik Lian
(74) *Attorney, Agent, or Firm* — Withrow & Terranova, PLLC

(57) ABSTRACT

Inductor packages employing wire-bonds over a lead frame to form integrated inductor(s), and related integrated circuit (IC) packages and fabrication methods. The inductor package includes one or more integrated inductors each formed from leads of a lead frame coupled together in a pattern through wire bonds to foil a coil(s). An overmold material is formed over the lead frame with the coil(s) formed from the wire-bonded leads to form the inductor package. The overmold material can include a magnetic material to further increase the inductance of the integrated inductor(s). The inductor package can be mounted to a package substrate of an IC package to provide an inductor(s) for a circuit in the IC package. By using a lead frame to form an inductor package, fabrication processes used to form lead frames can also be used to form the inductor package as a less complex, lower cost manufacturing method.

30 Claims, 17 Drawing Sheets

(51) Int. Cl.
*H10D 1/20* (2025.01)
*H10W 70/40* (2026.01)
*H10W 70/65* (2026.01)
*H10W 90/00* (2026.01)
*H01F 27/24* (2006.01)

(52) U.S. Cl.
CPC ......... *H10W 70/479* (2026.01); *H10W 70/65* (2026.01); *H10W 90/00* (2026.01); *H01F 27/24* (2013.01)

(58) Field of Classification Search
CPC ........... H01F 17/0006; H01F 2017/002; H01F 2017/004; H01F 2017/0073; H01F 27/28; H01F 27/2852; H01F 27/2804; H01L 23/49838; H01L 23/49861; H01L 24/49; H01L 23/5227; H01L 23/645; H10D 1/20
See application file for complete search history.

(56) References Cited

U.S. PATENT DOCUMENTS 7,107,666 B2 * 9/2006 Hiatt .................. H10W 44/501 29/603.24
7,129,578 B2 * 10/2006 Togawa ................ H10W 42/80 257/730
7,868,431 B2 1/2011 Feng et al.
7,952,460 B2 * 5/2011 Joehren ................ H01F 41/041 336/200
2005/0122198 A1 * 6/2005 Zhou .................... H01F 41/046 336/200
2006/0113664 A1 * 6/2006 Shiraishi .............. H10D 30/665 257/E23.047
2007/0128821 A1 * 6/2007 Lee .................... H01F 27/2804 257/E23.079
2007/0278516 A1 * 12/2007 Hashimoto ........... H10W 90/00 257/E23.085
2008/0224278 A1 9/2008 Prajuckamol et al.
2009/0134503 A1 5/2009 Feng et al.
2009/0160595 A1 * 6/2009 Feng .................... H01L 23/495 336/200
2009/0167477 A1 * 7/2009 Feng .................. H01F 17/0033 336/200
2009/0201115 A1 8/2009 Ghoshal et al.
2010/0230784 A1 9/2010 Teggatz et al.
2012/0280341 A1 * 11/2012 Franke .................. H10N 50/80 257/E29.323
2013/0119511 A1 * 5/2013 Shi ......................... H01F 41/04 336/200
2013/0307117 A1 * 11/2013 Koduri .................. H01L 23/645 336/200
2017/0062332 A1 * 3/2017 Kuwajima .......... H10W 20/497
2017/0125325 A1 * 5/2017 Shibuya .............. H10W 70/427
2017/0323848 A1 * 11/2017 Yamashita .......... H10W 90/811
2019/0180912 A1 * 6/2019 Cha ....................... H01F 41/042
2020/0211959 A1 * 7/2020 Hou .................. H01L 23/49534
2022/0220698 A1 * 7/2022 Yonekura .............. E02F 9/0858
2022/0278023 A1 * 9/2022 Liao ...................... H01L 23/481
2023/0163077 A1 * 5/2023 Lee .................... H01L 23/5384 257/774
2023/0352411 A1 * 11/2023 Choi ....................... H01L 25/50
2024/0222353 A1 * 7/2024 Higuchi ................. H10D 84/00

OTHER PUBLICATIONS

Bharath, K. et al., "Integrated Voltage Regulator Efficiency Improvement using Coaxial Magnetic Composite Core Inductors," 2021 IEEE 71st Electronic Components and Technology Conference (ECTC), Jun. 1-Jul. 4, 2021, San Diego, CA, USA, IEEE, 7 pages.
Roth, A. et al., "Heterogeneous Power Delivery for 7nm High-Performance Chiplet-Based Processors using Integrated Passive Device and In-Package Voltage Regulator," 2020 IEEE Symposium on VLSI Technology, Jun. 16-19, 2020, Honolulu, HI, USA, IEEE, 2 pages.
Sankarasubramanian, M. et al., "Magnetic Inductor Arrays for Intel® Fully Integrated Voltage Regulator (FIVR) on 10th generation Intel® Core™ SoCs," 2020 IEEE 70th Electronic Components and Technology Conference (ECTC), Jun. 2020, Orlando, FL, USA, IEEE, 6 pages.
Selvaraj, S.L. et al., "On-Chip Thin Film Inductor for High Frequency DC-DC Power Conversion Applications," 2020 IEEE Applied Power Electronics Conference and Exposition (APEC), Mar. 15-19, 2020, New Orleans, LA, USA, IEEE, 5 pages.
Yu, J. et al., "Demonstration of Substrate Embedded Ni—Zn Ferrite Core Solenoid Inductors Using a Photosensitive Glass Substrate," 2022 IEEE 72nd Electronic Components and Technology Conference (ECTC), May 31-Jun. 3, 2022, San Diego, CA, USA, IEEE, 5 pages.
Invitation to Pay Additional Fees and Partial International Search Report for International Patent Application No. PCT/US2023/070716, mailed Oct. 31, 2023, 18 pages.
International Search Report and Written Opinion for International Patent Application No. PCT/US2023/070716, mailed Dec. 21, 2023, 27 pages.

* cited by examiner

INDUCTOR PACKAGES EMPLOYING WIRE BONDS OVER A LEAD FRAME TO FORM INTEGRATED INDUCTOR(S), AND RELATED INTEGRATED CIRCUIT (IC) PACKAGES AND FABRICATION METHODS

BACKGROUND

I. Field of the Disclosure

The field of the disclosure relates to inductors in an inductor package that can be integrated in an integrated circuit (IC) package to provide inductance for circuits therein, such as an internal switched voltage regulator as part of a power distribution network as an example.

II. Background

Integrated circuits (ICs) are the cornerstone of electronic devices. ICs are packaged in an IC package, also called a "semiconductor package" or "chip package." The IC package includes one or more semiconductor dice ("dies" or "dice") that are mounted on and electrically coupled to a package substrate to provide physical support and an electrical interface to the die(s). A circuit solution that involves an IC package necessarily involves providing a power distribution network (PDN) for distributing power to the IC package to provide power to their die(s) for their operation. In this regard, a PDN may include a voltage regulator that is configured to receive power from a power source and then supply regulated power to an IC package and its die(s) for operation. For example, a voltage regulator can be provided as an external voltage regulator in a power management IC (PMIC) chip that is mounted to the same printed circuit board (PCB) as an IC package is mounted to. Power can be routed from the voltage regulator through electrical traces in the PCB to the IC package. In another example, the IC package can include an internal voltage regulator provided in an internal PMIC chip that that is configured to receive power through external interconnects of the IC package. The internal PMIC chip is configured to distribute regulated power to a die(s) in the IC package through electrical traces in the package substrate. Some IC packages that include an internal voltage regulator are also coupled to an external voltage regulator so that the PDN for the IC package is a dual-stage PDN. For example, the external voltage regulator may step down the direct current (DC) voltage (V) from 5 V to 1.8 V, and then the internal voltage regulator in the IC package may further step down the power from 1.8 V to 1.0 V. The internal voltage regulator can be a switch voltage regulator that uses a switching element to transform incoming power into a pulsed voltage for a higher efficiency of output power to input power.

It is important to provide an inductor(s) with a high inductance for switched voltage regulators, including an internal switched voltage regulator provided in an IC package. The inductor reduces voltage ripple in the output voltage generated by the switched voltage regulator by acting as an energy storage device to store energy when a switching transistor is turned on and supplying current when the switching transistor is turned off. To provide inductors that are sized large enough and have enough turns to have a desired amount of inductance for an internal voltage regulator in an IC package, the inductor for the voltage regulator can provided as an external discrete component from the voltage regulator. An external inductor can be mounted on the package substrate of an IC package as either as a land-side inductor or die-side inductor. The external inductor can be electrically coupled to the internal voltage regulator through the package substrate of the IC package. However, in this case, the inductor consumes area in the IC package. A die-side inductor consumes area laterally from a die(s) in the IC package. A land-side inductor consumes area underneath the package substrate that may increase the overall height of the IC package, if the inductor is taller than the external interconnects of the IC package. To conserve IC package area and size, the inductor could be formed internally within the package substrate of the IC package or within an existing die, such as a thin film inductor. However, this increases the fabrication complexity and cost of the package substrate and/or the die.

SUMMARY OF THE DISCLOSURE

Aspects disclosed herein include an inductor package employing wire-bonds over a lead frame to form an integrated inductor(s). Related integrated circuit (IC) packages and fabrication methods are also disclosed. A lead frame is a thin metal frame structure that has metal leads (as metal conductors) formed from a thin metal layer, such as from a stamping or etching process and extending from a pad area. In exemplary aspects, the inductor package includes one or more integrated inductors that are each formed from leads of a lead frame coupled together through wire bonds in a pattern to form an inductor coil. Leads of the lead frame coupled to each other by wire bonds can form a three-dimensional (3D) inductor coil(s). In one example, the lead frame includes at least two (2) adjacent columns each with a plurality of first, bottom leads, wherein first, bottom leads in the adjacent lead columns are coupled to each other through an extended, second top lead as a metal trace to form a portion of a coil. Wire bonds are then employed to couple second, top leads in different rows of the lead columns in a pattern to form a coil. An overmold material can be formed over the lead frame with the coil(s) formed from the wire-bonded leads to form the inductor package. In another aspect, the overmold material can include a magnetic material that surrounds and is disposed inside the internal area of the coil(s) of the inductors formed from the wire-bonded leads in the lead frame to further increase the inductance of the inductor(s) in the inductor package. The inductor package can be coupled to a package substrate of an IC package to provide an inductor for a circuit in the IC package, including without limitation an integrated voltage regulator. By using a lead frame to form an inductor(s) for an inductor package, fabrication processes that are used to form lead frames for supporting dies can also be used to form the integrated inductor in a less complex, lower cost manufacturing method. In yet other aspects, multiple inductor packages can be formed from a single lead frame that includes multiple, separate frame sections, where integrated inductors can be formed from leads in each separate frame section. The separate frame sections can be overmolded and then the separate frame sections separated (e.g., cut) to form separate inductor packages.

In this regard, in one exemplary aspect, an inductor package is provided. The inductor package includes a lead frame comprising a plurality of leads. Each lead of the plurality of leads is adjacent to another lead of the plurality of leads. The inductor package also includes an inductor comprising a conductive coil. The conductive coil comprises the plurality of leads, and one or more wire bonds each coupled to at least two (2) leads of the plurality of leads.

In another exemplary aspect, a method of fabricating an inductor package is provided. The method comprises providing a lead frame, wherein the lead frame comprises a plurality of leads, and each lead of the plurality of leads adjacent to another lead of the plurality of leads. The method also comprises forming a conductive coil comprising coupling each wire bond of one or more wire bonds to at least two (2) leads of the plurality of leads.

In another exemplary aspect, an integrated circuit (IC) package is provided. The IC package comprises a package substrate comprising a first surface and one or more first metallization layers each comprising one or more first metal interconnects. The IC package also comprises a die coupled to the first surface of the package substrate, the die coupled to at least one metal interconnect of the one or more metal interconnects. The IC package also comprises a power management die coupled to the package substrate, the power management die coupled to the at least one first metal interconnect coupled to the die and coupled to at least one second metal interconnect of the one or more metal interconnects. The IC package also comprises an inductor package coupled to the package substrate and coupled to the at least one second metal interconnect coupled to the power management die. The inductor package comprises a lead frame comprising a plurality of leads, wherein each lead of the plurality of leads is adjacent to another lead of the plurality of leads. The inductor package also comprises an inductor comprising a conductive coil coupled to the at least one second metal interconnect. The conductive coil comprises the plurality of leads, and one or more wire bonds each coupled to at least two (2) leads of the plurality of leads.

DETAILED DESCRIPTION

Figure 1:
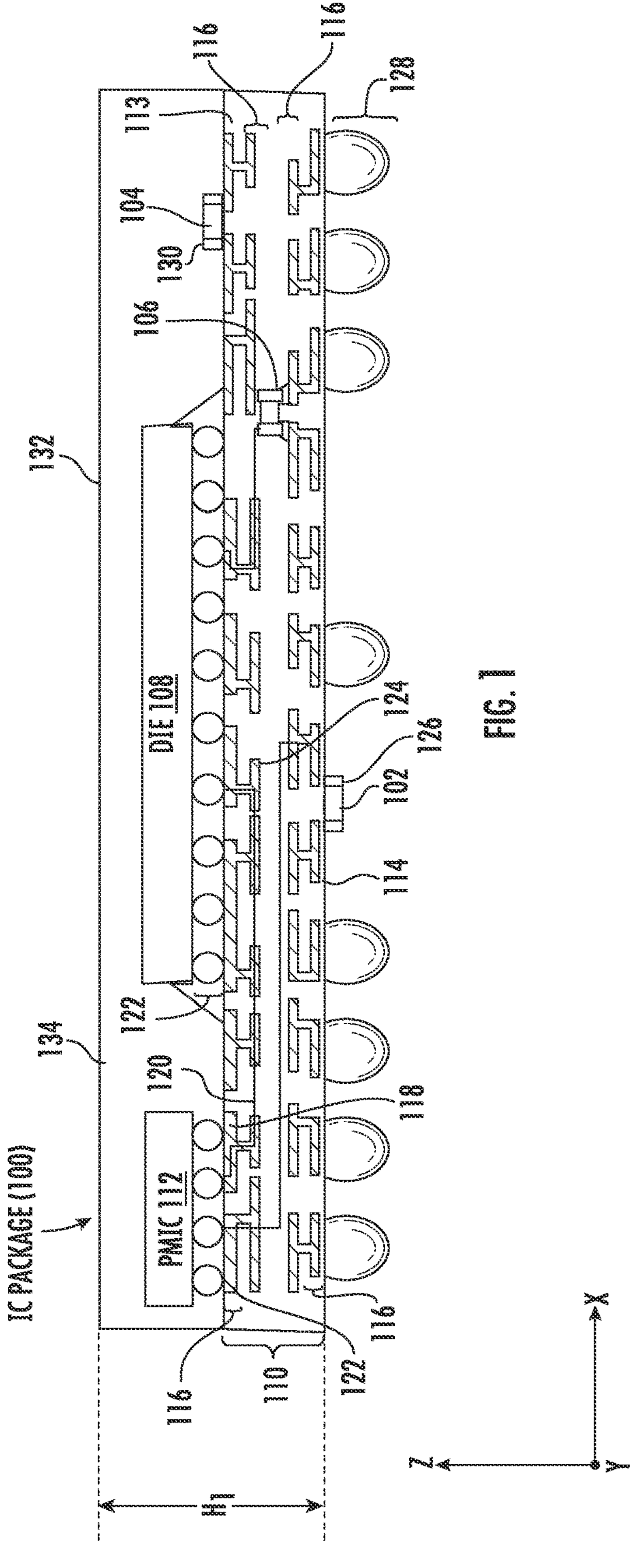
FIG. 1 is a side view of an exemplary integrated circuit (IC) package that includes a semiconductor die ("die") coupled to a package substrate, and further includes one or more exemplary inductor packages each coupled to the package substrate, wherein the inductor packages each employ wire-bonds over a lead frame to form an inductor coil(s) to form an inductor(s)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include an inductor package employing wire-bonds over a lead frame to form an integrated inductor(s). Related integrated circuit (IC) packages and fabrication methods are also disclosed. A lead frame is a thin metal frame structure that has metal leads (as metal conductors) formed from a thin metal layer, such as from a stamping or etching process and extending from a pad area. In exemplary aspects, the inductor package includes one or more integrated inductors that are each formed from leads of a lead frame coupled together through wire bonds in a pattern to form an inductor coil. Leads of the lead frame coupled to each other by wire bonds can form a three-dimensional (3D) inductor coil(s). In one example, the lead frame includes at least two (2) adjacent columns each with a plurality of first, bottom leads, wherein first, bottom leads in the adjacent lead columns are coupled to each other through an extended, second top lead as a metal trace to form a portion of a coil. Wire bonds are then employed to couple second, top leads in different rows of the lead columns in a pattern to form a coil. An overmold material can be formed over the lead frame with the coil(s) formed from the wire-bonded leads to form the inductor package. In another aspect, the overmold material can include a magnetic material that surrounds and is disposed inside the internal area of the coil(s) of the inductors formed from the wire-bonded leads in the lead frame to further increase the inductance of the inductor(s) in the inductor package. The inductor package can be coupled to a package substrate of an IC package to provide an inductor for a circuit in the IC package, including without limitation an integrated voltage regulator. By using a lead frame to form an inductor(s) for an inductor package, fabrication processes that are used to form lead frames for supporting dies can also be used to form the integrated inductor in a less complex, lower cost manufacturing method. In yet other aspects, multiple inductor packages can be formed from a single lead frame that includes multiple, separate frame sections, where integrated inductors can be formed from leads in each separate frame section. The separate frame sections can be overmolded and then the separate frame sections separated (e.g., cut) to form separate inductor packages.

In this regard, FIG. 1 is a side view of an IC package 100 that includes inductor packages in the form of a land-side inductor package 102, a die-side inductor package 104, and an embedded inductor package 106. As discussed in more detail below, the land-side inductor package 102 and the die-side inductor package 104 can include one or more integrated inductors each formed from leads in a lead frame coupled together through wire bonds to form respective coils. The IC package 100 includes a die 108 coupled to a package substrate 110. The die-side inductor package 104 is coupled to a first, top surface 113 of the package substrate 110 to be coupled to the package substrate 110. The land-side inductor package 102 is coupled to a second, bottom surface 114 of the package substrate 110 to be coupled to the package substrate 110. The embedded inductor package 106 is embedded within a metallization layer(s) 116 of the package substrate 110. The IC package 100 in this example also includes a power management integrated circuit (PMIC) die 112 that is coupled to the package substrate 110. The PMIC die 112 is configured to provide a regulated power signal (e.g., voltage signal) as a power source to the die 108 for its operation. The PMIC die 112 is configured to supply a power signal to the die 108 by being electrically coupled to the metal interconnects 118 that are coupled to metal lines 120 in the metallization layer(s) 116 of the package substrate 110. The metal lines 120 are directly or indirectly coupled to die interconnects 122 that are coupled to metal interconnects 124 of the package substrate 110 to electrically couple the PMIC die 112 to the die 108.

With continuing reference to FIG. 1, the land-side inductor package 102, the die-side inductor package 104, and/or the embedded inductor package 106 can be coupled to the die 108 and/or the PMIC die 112 to provide inductance to circuits therein. For example, the PMIC die 112 may include a switched voltage regulator circuit that requires inductance as an energy storage device to reduce voltage ripple in the power signal supplied to the die 108. The inductance of an inductor coupled to the PMIC die 112 must be sized large enough and have enough turns to have a desired amount of inductance for voltage regulation. However, in the example of the land-side inductor package 102 and die-side inductor package 104, it is desired that these packages 102, 104 not consume area that would increase the overall height Hi of the IC package. In the case of the land-side inductor package 102, it is desired that the height of land-side inductor package 102 is such that a first, bottom surface 126 of the land-side inductor package 102 does not extend beyond the external interconnects 128 of the IC package 100, which would increase the overall height of the IC package. In the case of the die-side inductor package 104, it is desired that the height of die-side inductor package 104 is such that a first, top surface 130 of the die-side inductor package 104 not extend beyond a first, top surface 132 of an overmold layer 134.

Figure 2A:
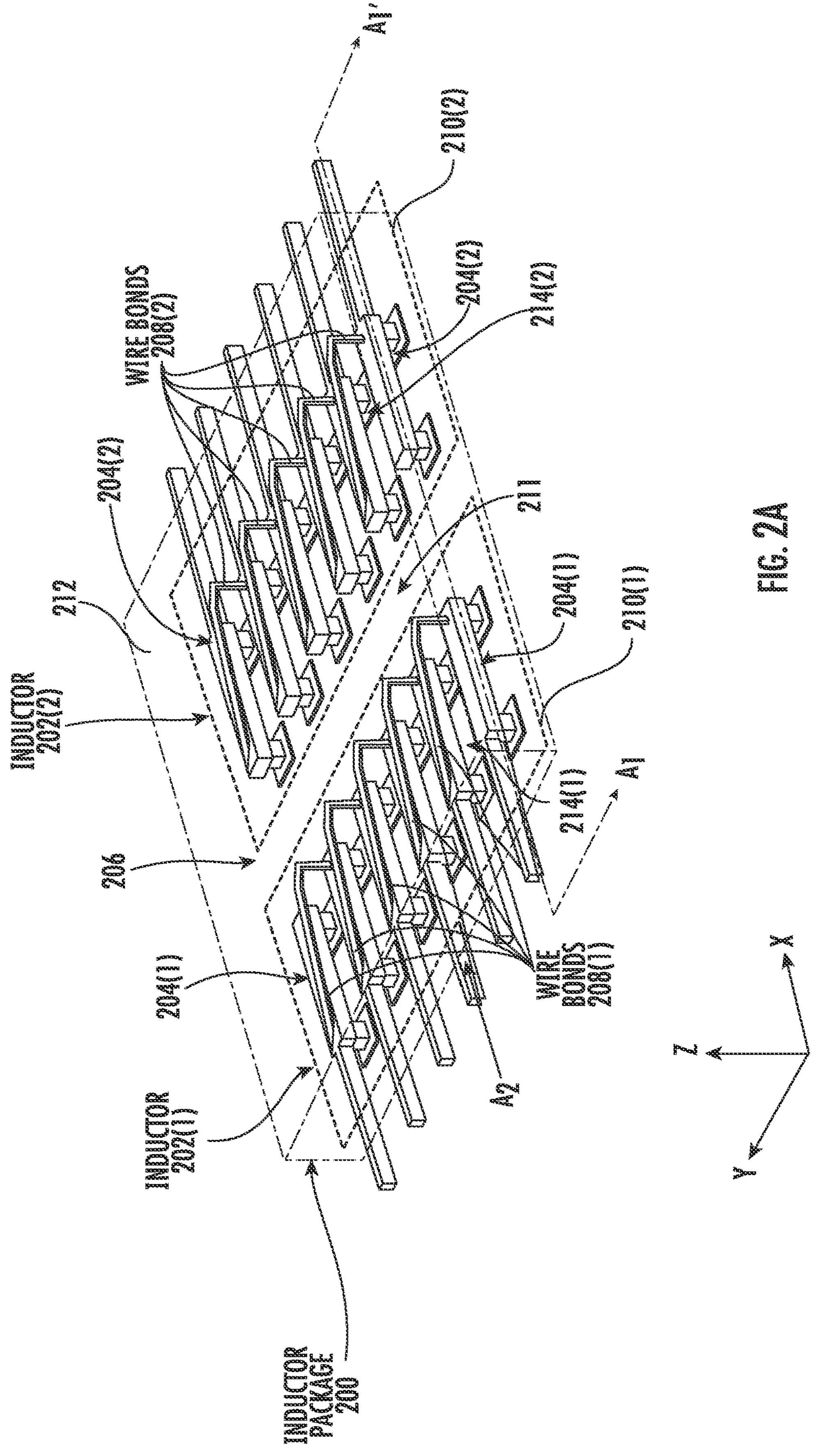
FIG. 2A is a top perspective view of an exemplary inductor package that includes two (2) separate integrated inductors each formed from leads in a lead frame coupled together through extended top leads and wire bonds.
Figure 2B:
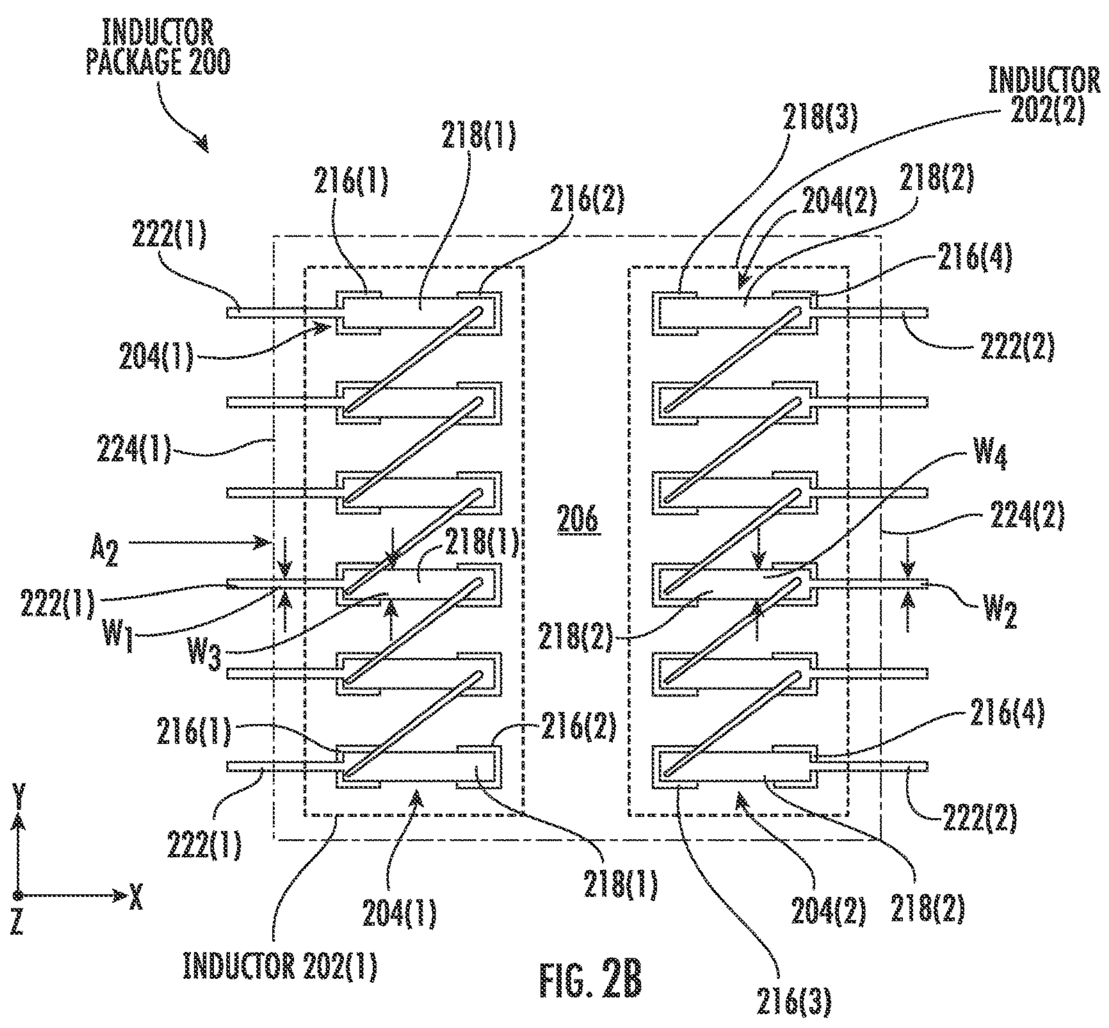
FIGS. 2B-2D are top, left side, and cross-sectional left side views, respectively, of the inductor package in FIG. 2A.
Figure 2C:
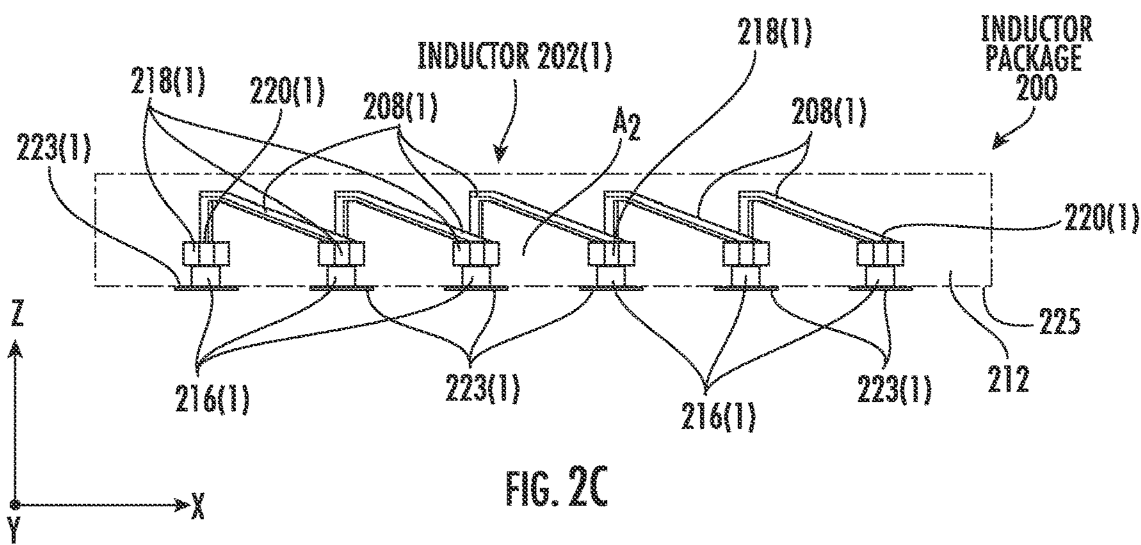
Figure 2D:
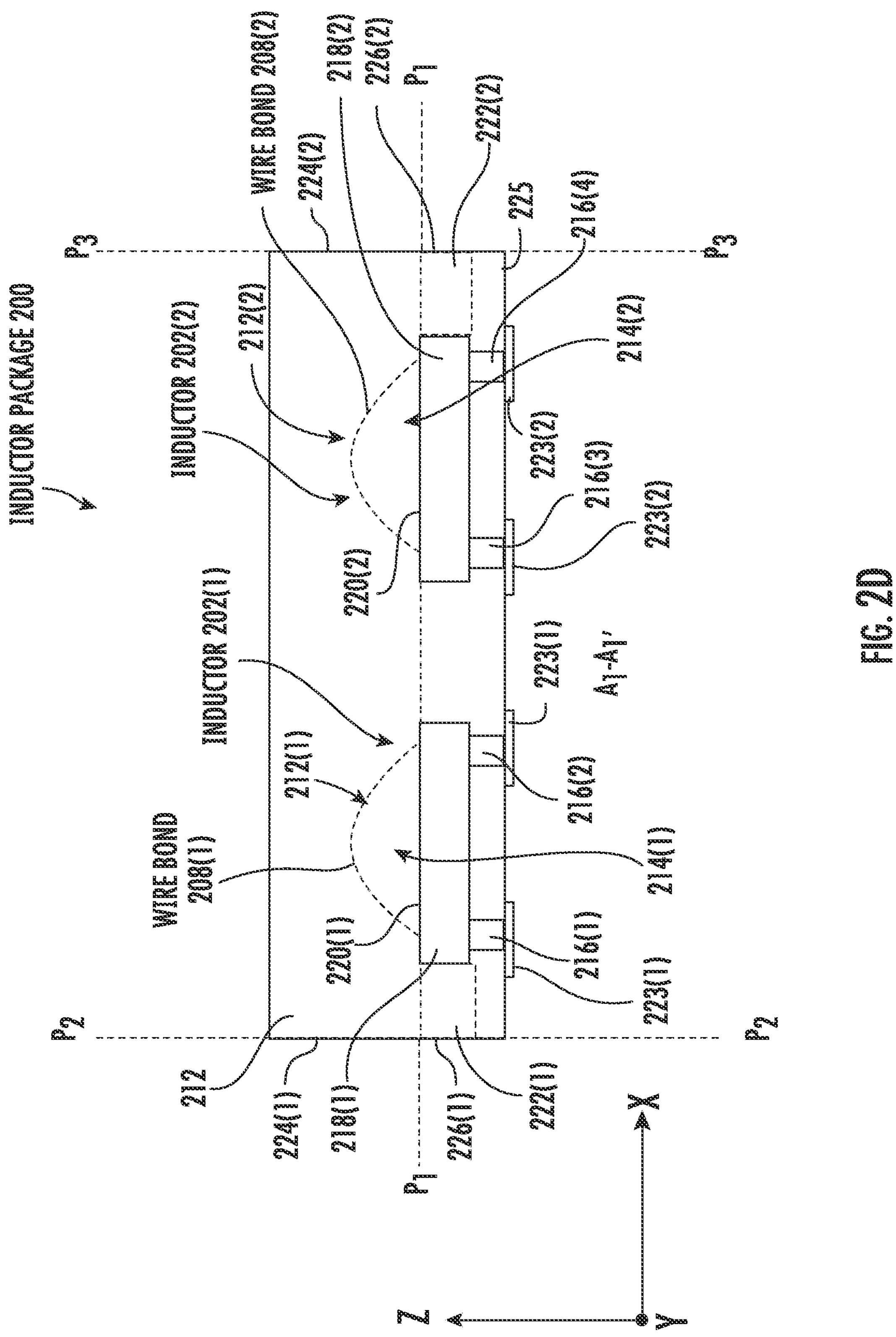

In this regard, to provide for an inductor package that has an inductor that has a reduced size and yet can provide the desired inductance in an IC package, such as the IC package 100 in FIG. 1, an exemplary inductor package 200 is provided in FIGS. 2A-2D. FIG. 2A is a top perspective view of the inductor package 200 that includes a first inductor 202(1) and second inductor 202(2), each formed from respective first and second leads 204(1), 204(2) in a lead frame 206 coupled together by first and second wire bonds 208(1), 208(2). FIGS. 2B-2D are top, front side and cross-sectional front side views across the $A_1$-$A_1$' line, respectively, of the inductor package 200 in FIG. 2A. FIG. 2C is a front side view in the Y-axis direction of the inductor package 200 in FIG. 2A, as shown in direction $A_2$ in FIG. 2A. The inductor package 200 in FIGS. 2A-2D can be used as the land-side inductor package 102 and/or the die-side inductor package 104 in the IC package 100 as examples.

As shown in FIG. 2A, the inductor package 200 includes the lead frame 206 that includes a plurality of metal leads ("leads") 204(1), 204(2), wherein each first and second lead 204(1), 204(2) is adjacent to at least one other respective first and second leads 204(1), 204(2). The lead frame 206 is a thin metal frame structure that has metal leads (in this example, first and second leads 204(1), 204(2) as metal conductors formed from a thin metal layer. The first and second leads 204(1), 204(2) are metal traces, lines or structures that are formed from a patterning of the lead frame 206, such as from a stamping or etching process. The first and second leads 204(1), 204(2) are created from and in the lead frame 206 as a result of metal material in the lead frame 206 that is not removed as a result of patterning the lead frame 206. The first and second leads 204(1), 204(2) are patterned in the lead frame 206 to extend outward from a pad area 211. Lead frames are conventionally to support a die, with the die supported in a die pad area with leads surrounding the pad area that can be coupled to the die. However, as discussed in more detail below, the lead frame 206 shown in FIGS. 2A-2D for the inductor package 200 is modified from a conventional design used to form the first and second leads 204(1), 204(2) to form inductors in the inductor package 200.

As shown in FIG. 2A, the inductor package 200 in this example includes the first and second inductors 202(1), 202(2) that are each formed from respective adjacent first and second leads 204(1), 204(2) of the lead frame 206 that coupled together through the first and second wire bonds 208(1), 208(2). The respective first and second leads 204(1), 204(2) of the lead frame 206 are coupled in a respective a pattern using first and second wire bonds 208(1), 208(2) to form respective inductor coils 210(1), 210(2). In this example, the first and second wire bonds 208(1), 208(2) are connected between adjacent respective first and second leads 204(1), 204(2) such that the first and second wire bonds 208(1), 208(2) extend up from the respective first and second leads 204(1), 204(2) in a vertical direction (Z-axis direction). In this manner, the respective formed first and second inductor coils 210(1), 210(2) are formed from the respective first and second leads 204(1), 204(2) being coupled to their adjacent first and second leads 204(1), 204(2) with the respective first and second wire bonds 208(1), 208(2) for respective three-dimensional (3D) first and second inductors 202(1), 202(2).

In this example of the inductor package 200, as shown in FIG. 2A, an overmold material 212 is disposed on the first and second leads 204(1), 204(2) and first and second wire bonds 208(1), 208(2) that form the respective first and second inductor coils 210(1), 210(2) to form the inductor package 200. The overmold material 212 can be any material that supports and protections the inductor coils 210(1), 210(2). In one example, the overmold material 212 is a magnetic material. Use of a magnetic material as the overmold material 212 to surround the inductor coils 210(1), 210(2) enhances (increases) the inductance of the first and second inductors 202(1), 202(2) formed from the respective inductor coils 210(1), 210(2). For example, the overmold material 214 in this example is disposed not only on the inductor coils 210(1), 210(2), but also a void space 214(1), 214(2) between the respective leads first and second 204(1), 204(2) and the first and second wire bonds 208(1), 208(2) coupled to and disposed above the first and second leads 204(1), 204(2) in a vertical direction (Z-axis direction). This creates a magnetic core within the respective inductor coils 210(1), 210(2) and a magnetic enclosure around the inductor coils 210(1), 210(2) to increase the strength of the magnetic field is emitted by the inductor coil s 210(1), 210(2) as a result of a current flowing through the inductor coils 210(1), 210(2).

FIGS. 2B-2D illustrates a top, side, and cross-sectional side views, respectively, of the inductor package 200 in FIG. 2A to describe other additional exemplary detail. As shown in FIGS. 2B-2D, in this example, each first lead 204(1) used to form the first inductor 202(1) has first and second bottom leads 216(1), 216(2) spaced apart from each other in a horizontal direction (Z-axis direction) with a first top lead 218(1) extending between and coupled to the first and second bottom leads 216(1), 216(2). Bottom leads are metal structures that are formed from patterning a lead frame as part of the forming leads. Bottom leads serve as vias for external connections to a top lead. The top lead is a metal conductor or trace to provide a connection to another element supported by a lead frame. Also, as shown in cross-sectional view of the inductor package 200 in FIG. 2D across the $A_1$-$A_1$' line in FIG. 2A, each second lead 204(2) used to form the second inductor 202(2) has first and second bottom leads 216(3), 216(4) spaced apart from each other in a horizontal direction (Z-axis direction) with a 2E(2) extending between and coupled to the first and second bottom leads 216(3), 216(4). As shown in FIG. 2D, first, top surfaces 220(1), 220(2) of the respective first and second top leads 218(1), 218(2) of the respective first and second leads 204(1), 204(2) are disposed in a first, horizontal plane $P_1$ (X-Y-axes plane). The first and second wire bonds 208(1), 208(2) coupling respective adjacent top first and second top leads 218(1), 218(2) together extend in a vertical direction (Z-axis) above and orthogonal to the first plane $P_1$ to form the void spaces 214(1), 214(2) of the respective inductor coils 210(1), 212(2). In this example, the first and second wire bonds 208(1), 208(2) are 50 micrometers (μm) in height from the first and second top leads 218(1), 218(2).

As shown in the top view of the inductor package 200 in FIG. 2B, each of the first and second top leads 218(1), 218(2) of the first and second leads 204(1), 204(2) have a first and second tail portion 222(1), 222(2) that extends out towards the respective sides 224(1), 224(2) of the inductor package 200 in horizontal directions (X-axis direction), The first and second tail portions 222(1), 222(2) of the respective first and second leads 204(1), 204(2) are a remnant of the fabrication of the lead frame 206. The first and second tail portions 222(1), 222(2) of the respective first and second leads 204(1), 204(2) can also provide terminals for providing electrical connections to the respective first and second inductors 202(1), 202(2). Alternatively, as shown in FIGS. 2C and 2D, first and second contact pads 223(1), 223(2) can be formed in contact with the respective first and bottom leads 216(1), 216(2) and exposed from a bottom surface 225 of the inductor package 200 to provide terminal connections points to the respective first and second inductors 202(1), 202(2). Each first and second tail portion 222(1), 222(2) has a respective width $W_1$, $W_2$ in a first direction (Y-axis direction) that is less than a respective width $W_3$, $W_4$ of the first and second top leads 218(1), 218(2) also in the first direction (Y-axis direction). As shown in FIG. 2D, the first and second tail portions 222(1), 222(2) can be cut such that their respective ends 226(1), 226(2) are co-planar in respective second and third vertical planes $P_2$, $P_3$ (Y-Z axes plane) with the sides 224(1), 224(2).

Figure 2E:
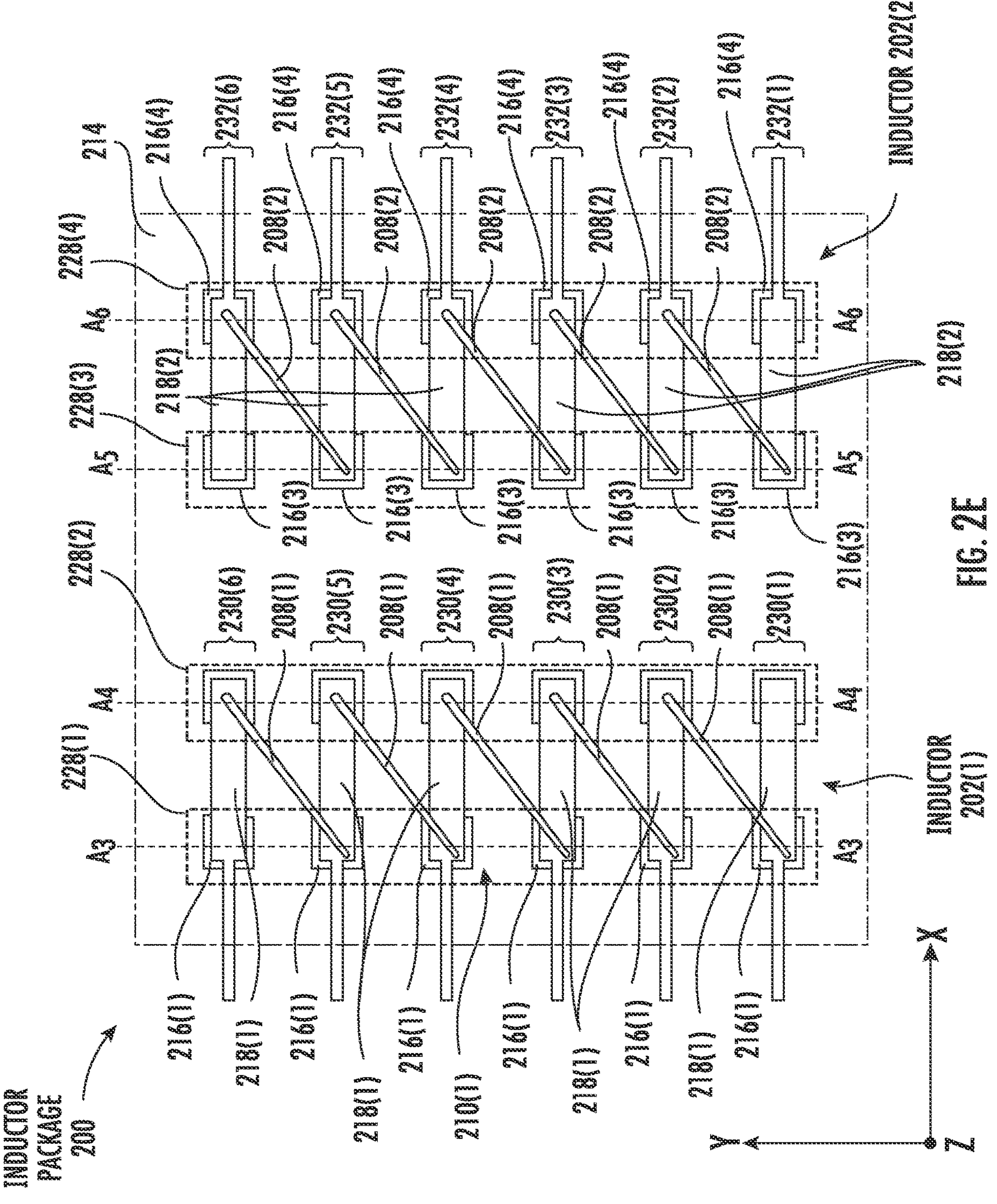
FIG. 2E is another top view of the inductor package in FIG. 2A.

As shown in FIG. 2B, in this example, to couple the respective first and second leads 204(1), 204(2) to each other with respective first and second wire bonds 208(1), 208(2) such that the inductor coils 210(1), 210(2) are formed, the first and second leads 204(1), 204(2) are coupled to each other in a cross pattern. This is illustrated in more detail in FIG. 2E, which is also a top view of the inductor package 200 in FIG. 2B. In this regard, as shown in FIG. 2E, to form the first inductor 202(1), the first bottom leads 216(1) of the first leads 204(1) are disposed in the lead frame 206 along a first longitudinal axis $A_3$ to form a first lead column 228(1). The second bottom leads 216(2) of the first leads 204(1) are disposed in the lead frame 206 along a second longitudinal axis $A_4$ to form a second lead column 228(2). First and second bottom leads 216(1), 216(2) are aligned adjacent to each other in the horizontal direction (X-axis direction) each forming a respective first lead rows 230(1)-230(6). To form the first inductor coil 210(1) for the first inductor 202(1), the 2E(1) above the first bottom lead 216(1) of a first lead 204(1) in a vertical direction (Z-axis direction) in a given first lead row 230(1)-230(5) are coupled through first wire bonds 208(1) to a respective second top lead 218(2) above a second bottom lead 216(2) of a first lead 204(1) in a vertical direction (Z-axis direction) in an adjacent, respective first lead row 230(2)-230(6). In this manner, the first wire bonds 208(1) are disposed in contact with the first leads 204(1) in adjacent first lead rows 230(1)-230(6) in a cross pattern to form a 3D first inductor coil 210(1) for the first inductor 202(1).

Similarly, as shown in FIG. 2E, to form the second inductor 202(2), the second bottom leads 216(3) of the second leads 204(2) are disposed in the lead frame 206 along a third longitudinal axis $A_5$ to form a third lead column 228(3). The second bottom leads 216(2) of the second leads 204(2) are disposed in the lead frame 206 along a fourth longitudinal axis $A_6$ to form a fourth lead column 228(4). First and second bottom leads 216(3), 216(4) are aligned adjacent to each other in the horizontal direction (X-axis direction), each forming a respective second lead rows 232(1)-232(6). To form the second inductor coil 210(2) for the second inductor 202(2), the second top lead 218(2) above the first bottom leads 216(3) of a second lead 204(2) in a vertical direction (Z-axis direction) in a given first lead row 232(1)-232(5) are coupled through second wire bonds 208(2) to a respective second top lead 216(2) above a second bottom lead 216(4) of a second lead 204(2) in a vertical direction (Z-axis direction) in an adjacent, respective second lead row 232(2)-232(6). In this manner, the second wire bonds 208(2) are disposed in contact with the second leads 204(2) in adjacent second lead rows 232(1)-232(6) in a cross pattern to form a 3D second inductor coil 210(2) for the second inductor 202(2).

Figures 3A, 3B:
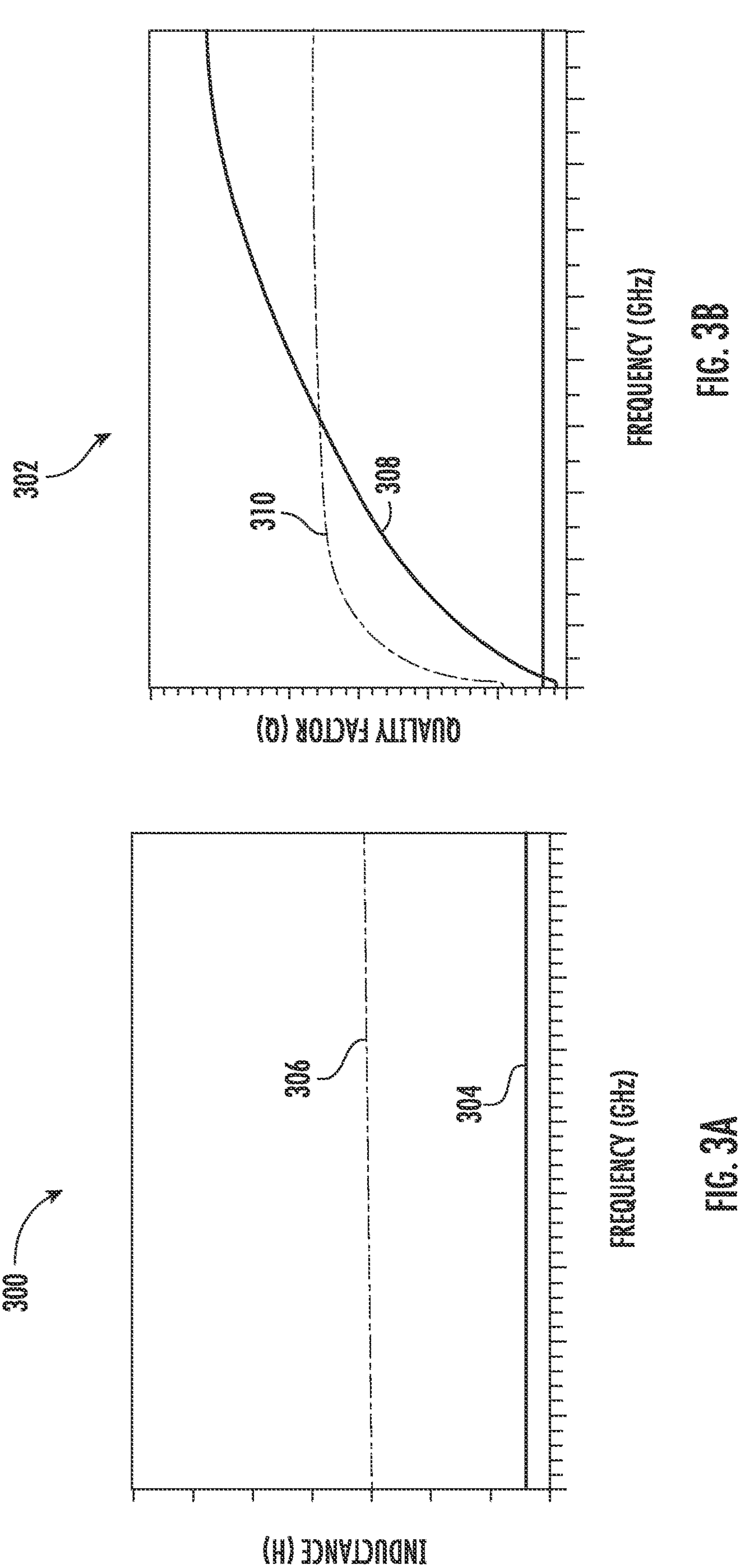
FIGS. 3A and 3B are graphs illustrating respective exemplary inductance and quality (Q) factor of the inductors formed from wire-bonded leads of the lead frame in the inductor package in FIGS. 2A-2E.

FIGS. 3A and 3B are graphs 300, 302 illustrating respective exemplary inductance and quality (Q) factor of the first and second inductors 202(1), 202(2) formed from wire-bonded first and second leads 204(1), 204(2) of the lead frame 206 in the inductor package 200 in FIGS. 2A-2E. As shown in FIG. 3A, curve 304 illustrates the inductance (H) as a function of frequency in GigaHertz (GHz) for each of the first and second inductors 202(1), 202(2) if the overmold material 212 is not made from a magnetic material. Curve 306 illustrates the inductance (H) as a function of frequency in GigaHertz (GHz) for each of the first and second inductors 202(1), 202(2) if the overmold material 212 is made from a magnetic material, to provide a magnetic core and magnetic enclosure for the first and second inductors 202(1), 202(2). Use of a magnetic material as the overmold material 212 to provide a magnetic core and magnetic enclosure to the first and second inductors 202(1), 202(2) can increase the inductance of the first and second inductors 202(1), 202(2) (e.g., 7.5 times the inductance).

As shown in FIG. 3B, curve 308 illustrates the quality factor (Q) as a function of frequency in GigaHertz (GHz) for each of the first and second inductors 202(1), 202(2) if the overmold material 212 is not made from a magnetic material. Curve 310 illustrates the quality factor (Q) as a function of frequency in GigaHertz (GHz) for each of the first and second inductors 202(1), 202(2) if the overmold material 212 is made from a magnetic material to provide a magnetic core and magnetic enclosure for the first and second inductors 202(1), 202(2). Use of a magnetic material as the overmold material 212 to provide a magnetic core and magnetic enclosure to the first and second inductors 202(1), 202(2) can increase the quality factor (Q) of the first and second inductors 202(1), 202(2) at lower frequencies.

Figure 4:
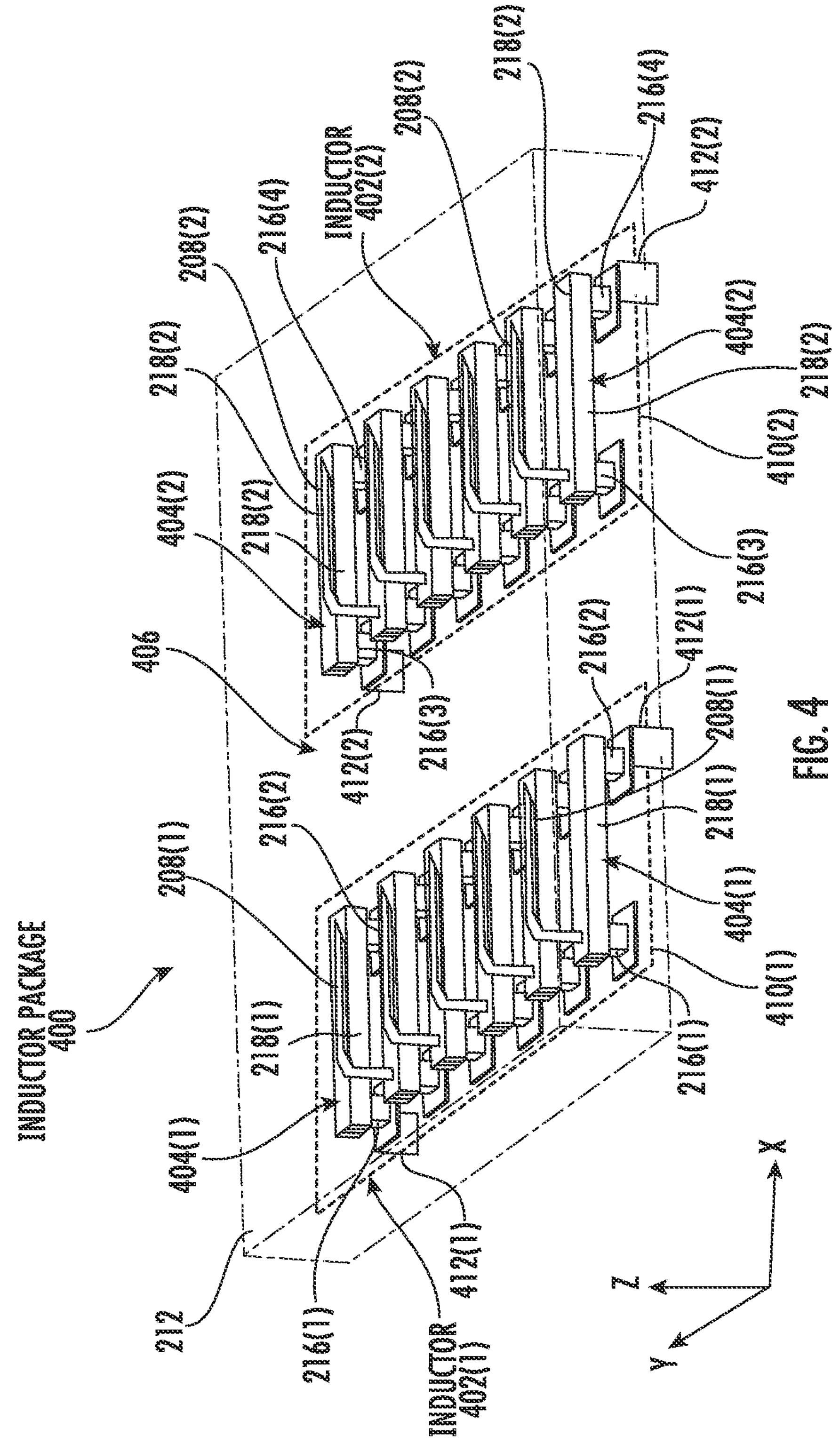
FIG. 4 is a top perspective view of another exemplary inductor package similar to the inductor package in FIGS. 2A-2E, but wherein the leads used to form the integrated inductors do not include lead tails.

FIG. 4 is a top perspective view of another exemplary inductor package 400 that is similar to the inductor package 200 in FIGS. 2A-2E. However, in the inductor package 400 in FIG. 4, the leads used to form the integrated inductors do not include tail portions like the first and second tail portions 222(1), 222(2) in the inductor package 200. As previously discussed above, the first and second tail portions 222(1), 222(2) in the inductor package 200 are remnants of the particular lead frame 206 used to form the inductor coils 210(1), 210(2) of the first and second inductors 202(1), 202(2) in the inductor package 200 in FIGS. 2A-2E. As shown in FIG. 4, the inductor package 400 includes a lead frame 406 that includes a plurality of metal leads ("leads") 404(1), 404(2) that are like the first and second leads 204(1), 204(2) in FIGS. 2A-2E, but do not include tail portions. The inductor package 400 in this example includes the first and second inductors 402(1), 402(2) that are each formed from respective adjacent first and second leads 404(1), 404(2) of the lead frame 406 that are coupled together through first and second wire bonds 208(1), 208(2) like in FIGS. 2A-2E. Respective formed inductor coils 410(1), 410(2) are formed from the respective first and second leads 404(1), 404(2) being coupled to their adjacent first and second leads 404(1), 404(2) with the respective first and second wire bonds 208(1), 208(2) for respective three-dimensional (3D) first and second inductors 402(1), 402(2). Because the first and second leads 404(1), 404(2) in the inductor package 400 in FIG. 4 do not have tail portions, terminals 412(1), 412(2) can be provided or coupled to the first and second bottom leads 216(1), 216(2) to provide connections to the respective first and second inductors 402(1), 402(2). Common components between the inductor package 200 in FIGS. 2A-2E and the inductor package 400 in FIG. 4 are shown with common element numbers and are not re-described. Other options and features described for the inductor package 200 in FIGS. 2A-2E can also be provided in the inductor package 400 in FIG. 4.

Figures 5A, 5B:
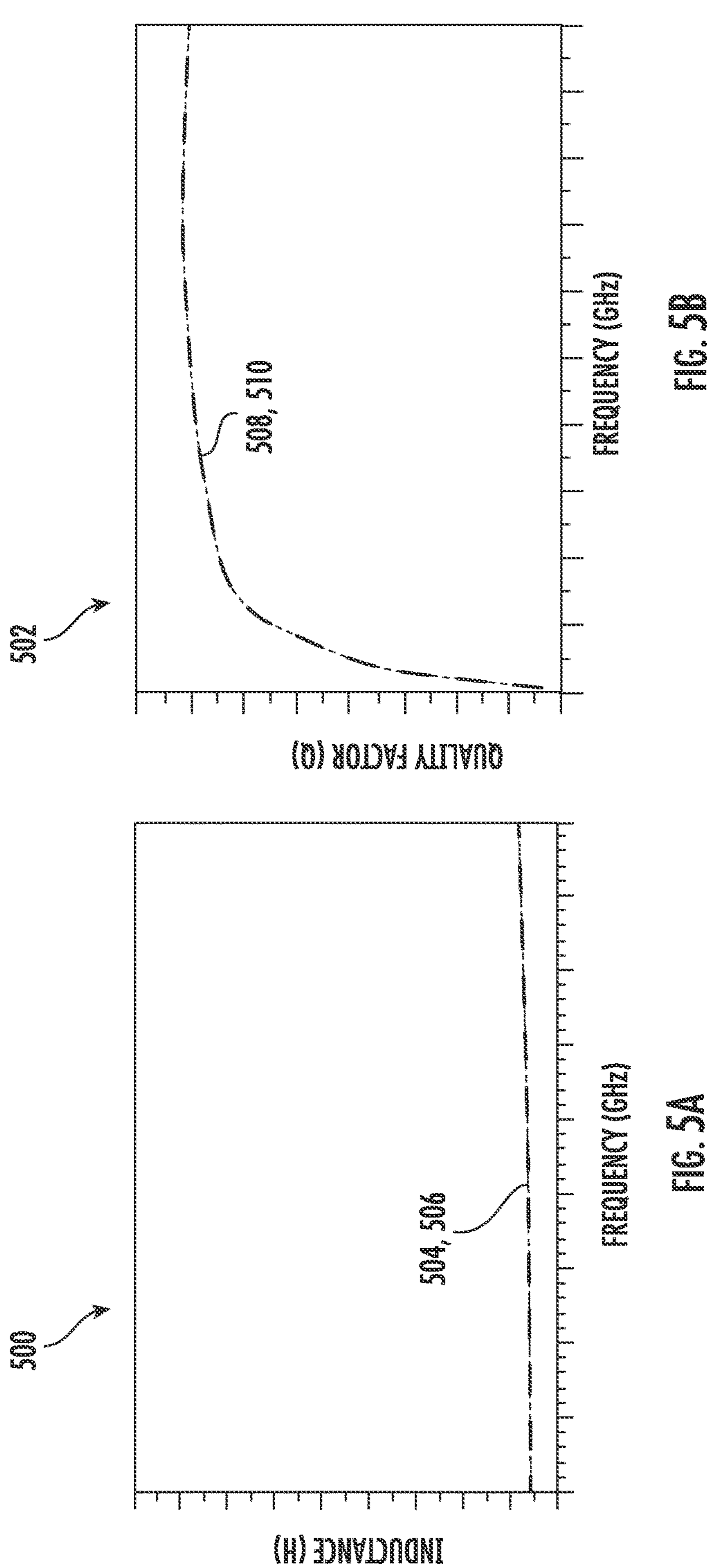
FIGS. 5A and 5B are graphs illustrating respective exemplary inductance and quality (Q) factor of the integrated inductors formed from wire-bonded leads of the lead frame in the inductor package of FIG. 4 as compared to the inductor package in FIGS. 2A-2E.

FIGS. 5A and 5B are graphs 500, 502 illustrating respective exemplary inductance and quality (Q) factor of the first and second inductors 402(1), 402(2) in the inductor package 400 in FIG. 4 if formed from wire-bonded first and second leads 404(1), 404(2) of the lead frame 406 that do not include tail portions versus including first and second inductors 202(1), 202(2) in the inductor package 200 in FIGS. 2A-2E that have first and second leads 204(1), 204(2) with tail portions. As shown in FIG. 5A, curve 504 illustrates the inductance (H) as a function of frequency in GigaHertz (GHz) for each of the first and second inductors 202(1), 202(2) in the inductor package 200 in FIGS. 2A-2E with the inclusion of first and second tail portions 222(1), 222(2) on the respective first and second leads 204(1), 204(2). Curve 506 illustrates the inductance (H) as a function of frequency in GigaHertz (GHz) for each of the first and second inductors 402(1), 402(2) in the inductor package 400 in FIG. 4 without the inclusion of tail portions on the respective first and second leads 404(1), 404(2). As shown, the inclusion or removal of tail portions from first and second leads 404(1), 404(2) of the inductor package 400 in FIG. 4 does not affect or substantially affect the impedance performance of the first and second inductors 402(1), 402(1) in the inductor package 400.

As shown in FIG. 5B, curve 508 illustrates the quality factor (Q) as a function of frequency in GigaHertz (GHz) for each of the first and second inductors 402(1), 402(2) in the inductor package 400 in FIG. 4 if formed from wire-bonded first and second leads 404(1), 404(2) that do not include tail portions vs. including tail portions. As shown in FIG. 5B, curve 508 illustrates the quality factor (Q) as a function of frequency in GigaHertz (GHz) for each of the first and second inductors 202(1), 202(2) in the inductor package 200 in FIGS. 2A-2E with the inclusion of first and second tail portions 222(1), 222(2) on the respective first and second leads 204(1), 204(2). Curve 510 illustrates the quality factor (Q) as a function of frequency in GigaHertz (GHz) for each of the first and second inductors 402(1), 402(2) in the inductor package 400 in FIG. 4 without the inclusion of tail portions on the respective first and second leads 404(1), 404(2). As shown, the inclusion or removal of tail portions from first and second leads 404(1), 404(2) of the inductor package 400 in FIG. 4 does not affect or substantially affect the quality factor (Q) performance of the first and second inductors 402(1), 402(1) in the inductor package 400.

Figure 6:
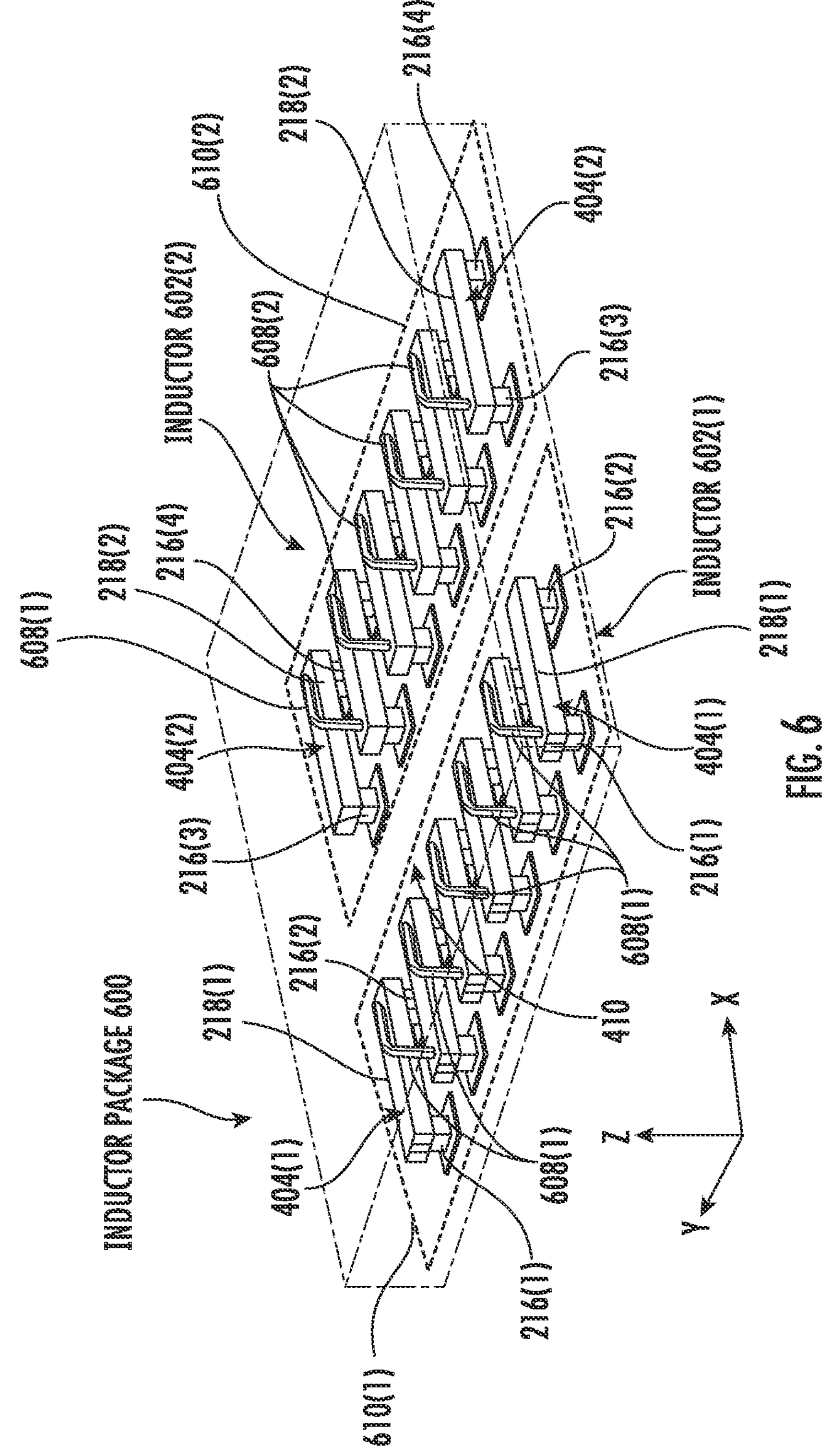
FIG. 6 is a top perspective view of another exemplary inductor package similar to the inductor package in FIGS. 2A-2E, but wherein taller wire bonds couple leads in adjacent lead columns to change the inductance behavior of the integrated inductors in the inductor package.

FIG. 6 is a top perspective view of another exemplary inductor package 600 that is similar to the inductor package 400 in FIG. 4. However, in the inductor package 600 in FIG. 6, first and second wire bonds 608(1), 608(2) used to couple the respective first and second leads 204(1), 204(2) together to form inductor coils 610(1), 610(2) are taller in height (e.g., 100 micrometers (μm) from the first and second top leads 218(1), 218(2). As shown in FIG. 6, the inductor package 600 includes the lead frame 406 that includes a plurality of metal leads ("leads") 404(1), 404(2) like in the inductor package 400 in FIG. 4. Common components between the inductor package 400 in FIG. 4 and the inductor package 600 in FIG. 6 are shown with common element numbers and are not re-described. Other options and features described for the inductor packages 200, 400 in FIGS. 2A-2E and 4 can also be provided in the inductor package 600 in FIG. 6.

Figures 7A, 7B:
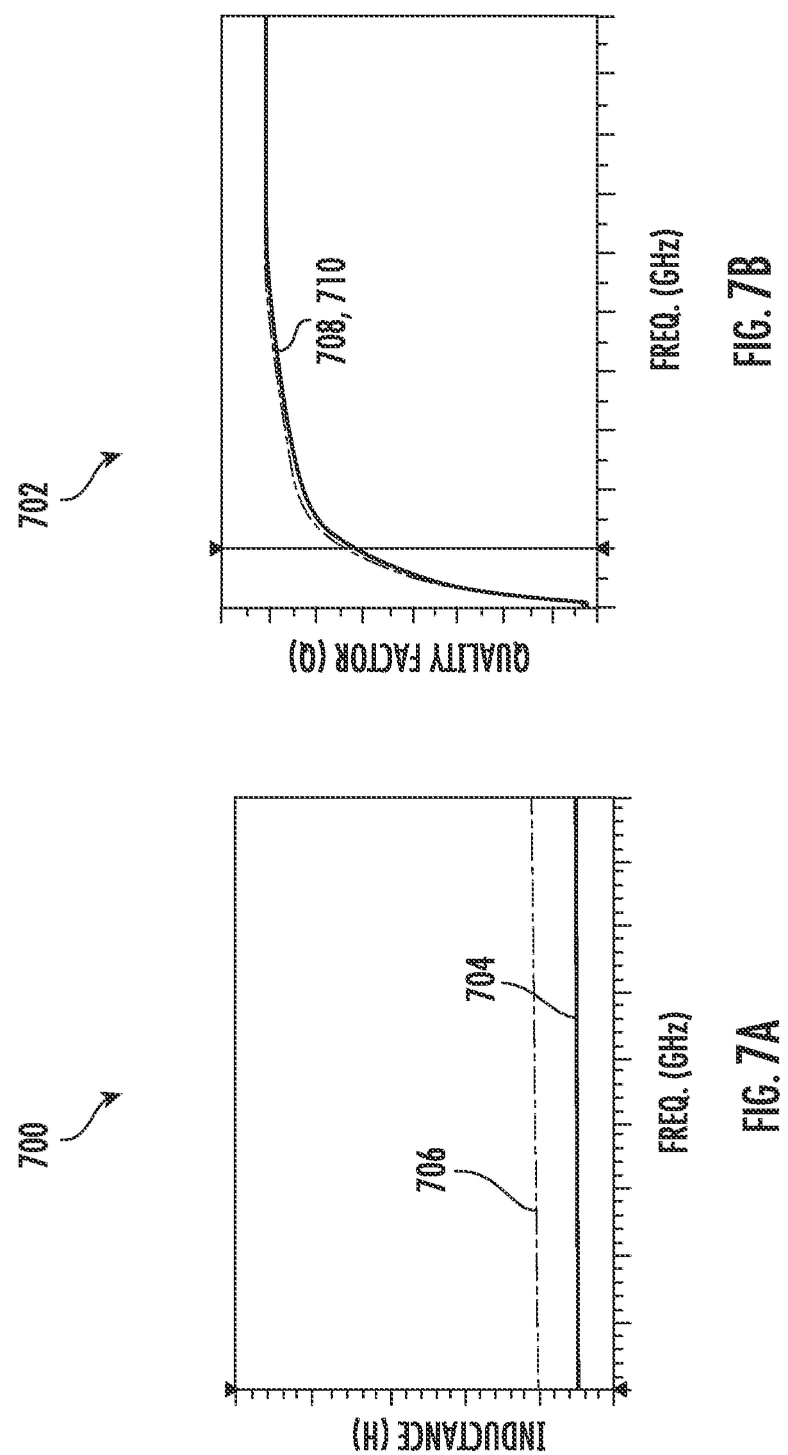
FIGS. 7A and 7B are graphs illustrating respective exemplary inductance and quality (Q) factor of the inductors formed from wire-bonded leads of the lead frame in the inductor package in FIG. 6 as compared to the inductor package in FIGS. 2A-2E.

FIGS. 7A and 7B are graphs 700, 702 illustrating respective exemplary inductance and quality (Q) factor of the first and second inductors 602(1), 602(2) in the inductor package 600 in FIG. 6 with taller height first and second wire bonds 608(1), 608(2) versus first and second inductors 402(1), 402(2) in the inductor package 400 in FIG. 4 with shorter wire bonds 408(1), 408(2). As shown in FIG. 7A, curve 704 illustrates the inductance (H) as a function of frequency in GigaHertz (GHz) for each of the first and second inductors 402(1), 402(2) in the inductor package 400 in FIG. 4 with the reduced height first and second wire bonds 208(1), 208(2). Curve 706 illustrates the inductance (H) as a function of frequency in GigaHertz (GHz) for each of the first and second inductors 602(1), 602(2) in the inductor package 600 in FIG. 6 with taller height first and second wire bonds 608(1), 608(2). As shown, providing taller height first and second wire bonds 608(1), 608(2) increases the magnetic field strength of the first and second inductors 602(1), 602(2), because the height of the 608(1), 608(2) affects the geometry of the inductor coils 610(1), 610(2) formed from the first and second leads 404(1), 404(2) and the first and second wire bonds 608(1), 608(2).

As shown in FIG. 7B, curve 708 illustrates the quality factor (Q) as a function of frequency in GigaHertz (GHz) for each of the first and second inductors 602(1), 602(2) in the inductor package 600 in FIG. 6 with taller wire first and second bonds 608(1), 608(2) versus first and second inductors 402(1), 402(2) in the inductor package 400 in FIG. 4 with shorter wire bonds 408(1), 408(2). As shown in FIG. 7B, curve 708 illustrates the quality factor (Q) as a function of frequency in GigaHertz (GHz) for each of the first and second inductors 402(1), 402(2) in the inductor package 400 in FIG. 4 with taller height first and second wire bonds 208(1), 208(2). Curve 710 illustrates the quality factor (Q) as a function of frequency in GigaHertz (GHz) for each of the first and second inductors 602(1), 602(2) in the inductor package 600 in FIG. 6 without taller height first and second wire bonds 608(1), 608(2). As shown, the height of the first and second wire bonds 608(1), 608(2) in the inductor package 600 in FIG. 6 does not negatively affect the quality factor (Q) performance of the first and second inductors 602(1), 602(1) in the inductor package 600.

Figure 8:
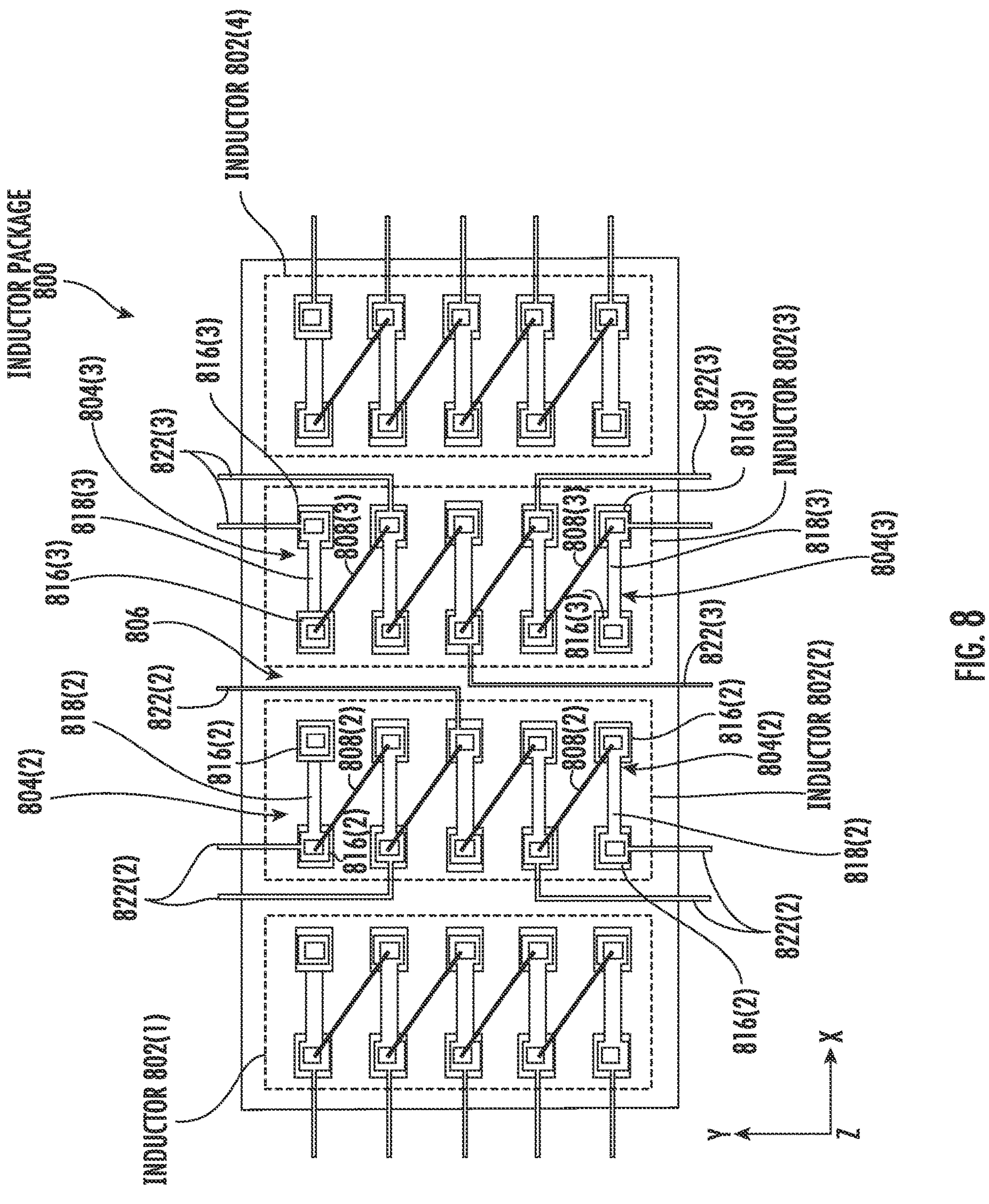
FIG. 8 is a top perspective view of another exemplary inductor package that includes four (4) separate integrated inductors each formed from leads in a lead frame coupled together through extended top leads and wire bonds.

FIG. 8 is a top perspective view of another exemplary inductor package 800 that includes four (4) separate integrated inductors 802(1)-802(4) each formed from leads in a lead frame 806 coupled together through extended top leads and wire bonds. Inductors 802(1) and 802(4) and their components are the same as first and second inductors 202(1), 202(1) in the inductor package 200 in FIGS. 2A-2E, and thus are not re-described. The lead frame 806 in the inductor package 800 also includes two (2) additional inductors 802(2), 802(3). To make room for tail portions 822(2), 822(3) of the third and fourth leads 804(2), 804(3) in the lead frame 806, since inductors 802(1), 802(4) impede their path in a first horizontal direction (X-axis direction), the lead frame 806 provides for the tail portions 822(2), 822(3) of the third and fourth leads 804(2), 804(3) to extend in a second horizontal direction (Y-axis direction) that is orthogonal to the first horizontal direction as shown in FIG. 8. The inductors 802(2), 802(3) in the inductor package 800 in FIG. 8 include third and fourth leads 804(2), 804(3) that are like the first and second leads 204(1), 204(2) in the inductor package 200 in FIGS. 2A-2E. The inductors 802(2), 802(3) in the inductor package 800 in FIG. 8 are coupled by third and fourth wire bonds 808(2), 808(3) that are like the first and second wire bonds 208(1), 208(2) in the inductor package 200 in FIGS. 2A-2E. The third and fourth leads 804(2), 804(3) in the inductor package 800 in FIG. 8 include respective bottom leads 816(2), 816(3) and top leads 818(2), 818(3) that are like the bottom leads 216(1)-216(4) and first and second top leads 218(1), 218(2) in the inductor package 200 in FIGS. 2A-2E.

Figure 9:
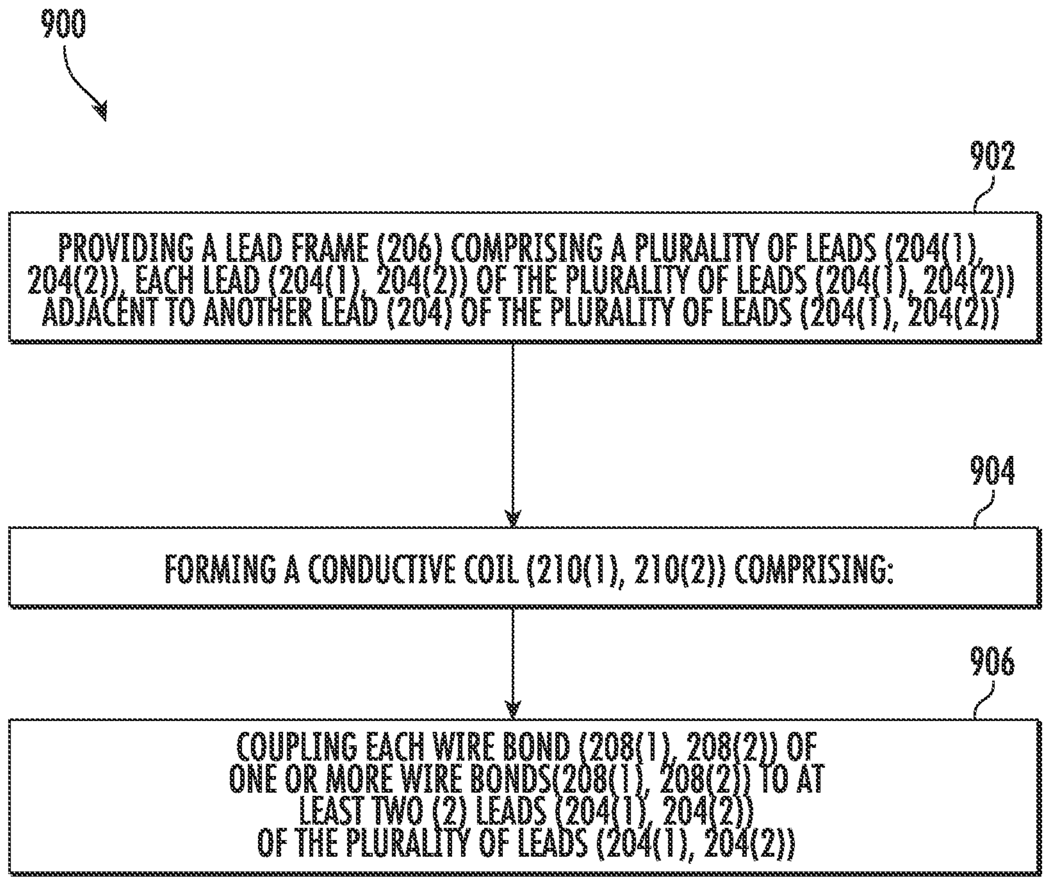
FIG. 9 is flowchart illustrating an exemplary fabrication process of fabricating an inductor package that includes one or more integrated inductors each formed from leads in a lead frame coupled together through extended top leads and wire bonds to form respective coils, including but not limited to the inductor packages in FIGS. 2A-2E, 4, 6, and 8.

Fabrication processes can be employed to fabricate inductor packages that include one or more integrated inductors each formed from leads in a lead frame coupled together through wire bonds to form respective coils, including but not limited to the inductor packages 200, 400, 600, 800 in FIGS. 2A-2E, 4, 6, and 8. In this regard, FIG. 9 is a flowchart illustrating an exemplary fabrication process 900 of fabricating inductor packages that include one or more integrated inductors each formed from leads in a lead frame coupled together through wire bonds to form respective coils, including but not limited to the inductor packages 200, 400, 600, 800 in FIGS. 2A-2E, 4, 6, and 8. The fabrication process 900 in FIG. 9 is discussed with regard to the inductor package in FIGS. 2A-2E, but note that the fabrication process 600 is not limited to fabricating an inductor package like the inductor package 200 in FIGS. 2A-2E.

In this regard, as shown in FIG. 9, a first step of the fabrication process 900 in this example is providing a lead frame 206 comprising a plurality of leads 204(1), 204(2), each lead 204(1), 204(2) of the plurality of leads 204(1), 204(2) adjacent to another lead 204 of the plurality of leads 204(1), 204(2) (block 902 in FIG. 9). A second step of the fabrication process in this example is forming a first and second conductive coil 210(1), 210(2) (block 904 in FIG. 9). The first and second conductive coils 210(1), 210(2) are formed by coupling each first and second wire bond 208(1), 208(2) of one or more wire bonds 208(1), 208(2) to at least two (2) leads 204(1), 204(2) of the plurality of leads 204(1), 204(2) (block 906 in FIG. 9).

Figures 10A, 11A, 11B:
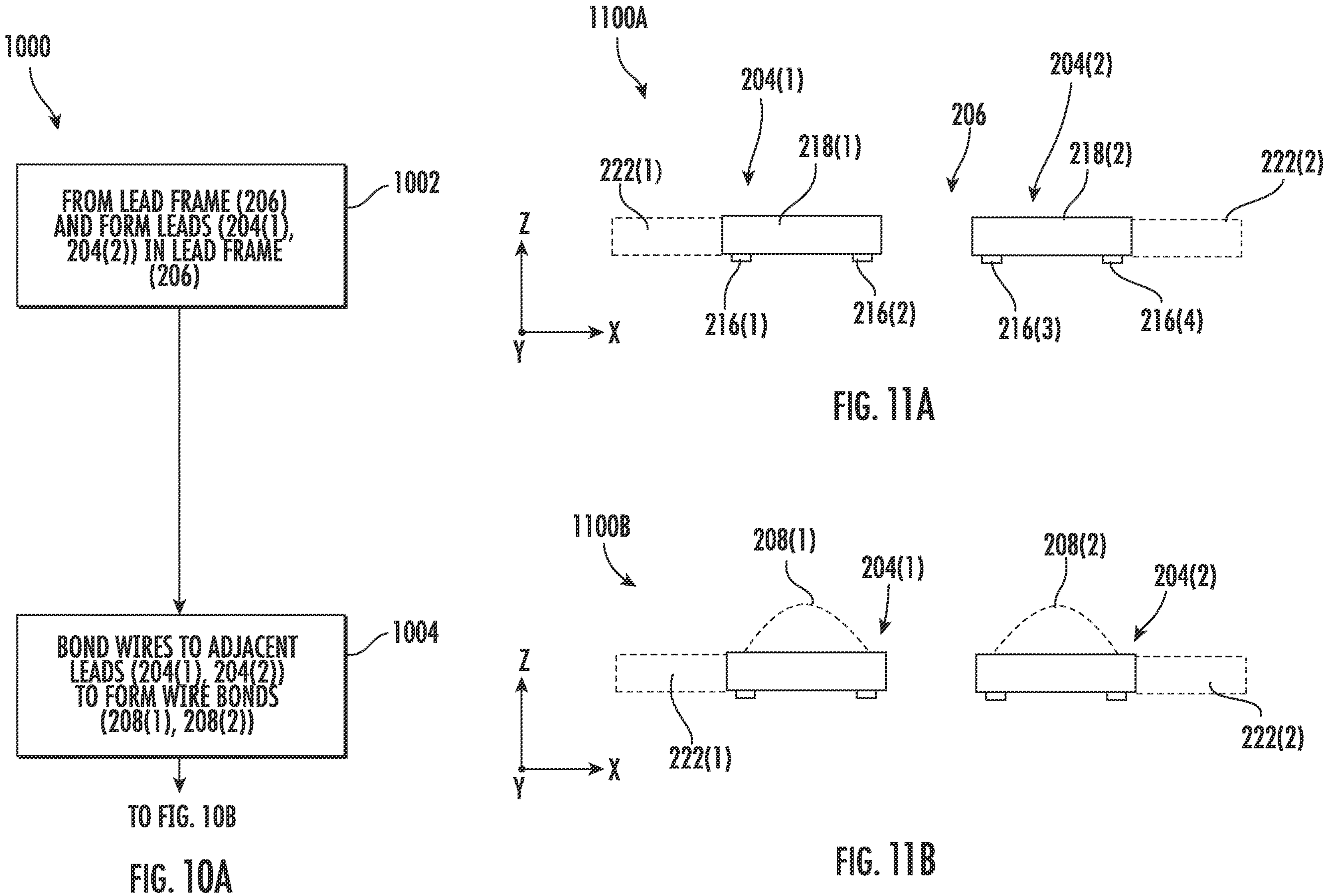
FIGS. 10A and 10B is a flowchart illustrating another exemplary fabrication process of fabricating an integrated inductor in the form of an inductor package that includes one or more inductors each formed from leads in a lead frame coupled together through extended top leads and wire bonds, including but not limited to the inductor packages in FIGS. 2A-2E, 4, 6, and 8.
FIGS. 11A-11D are exemplary fabrication stages during fabrication of an integrated inductor according to the exemplary fabrication process in FIGS. 10A and 10B.
Figures 10B, 11C, 11D:
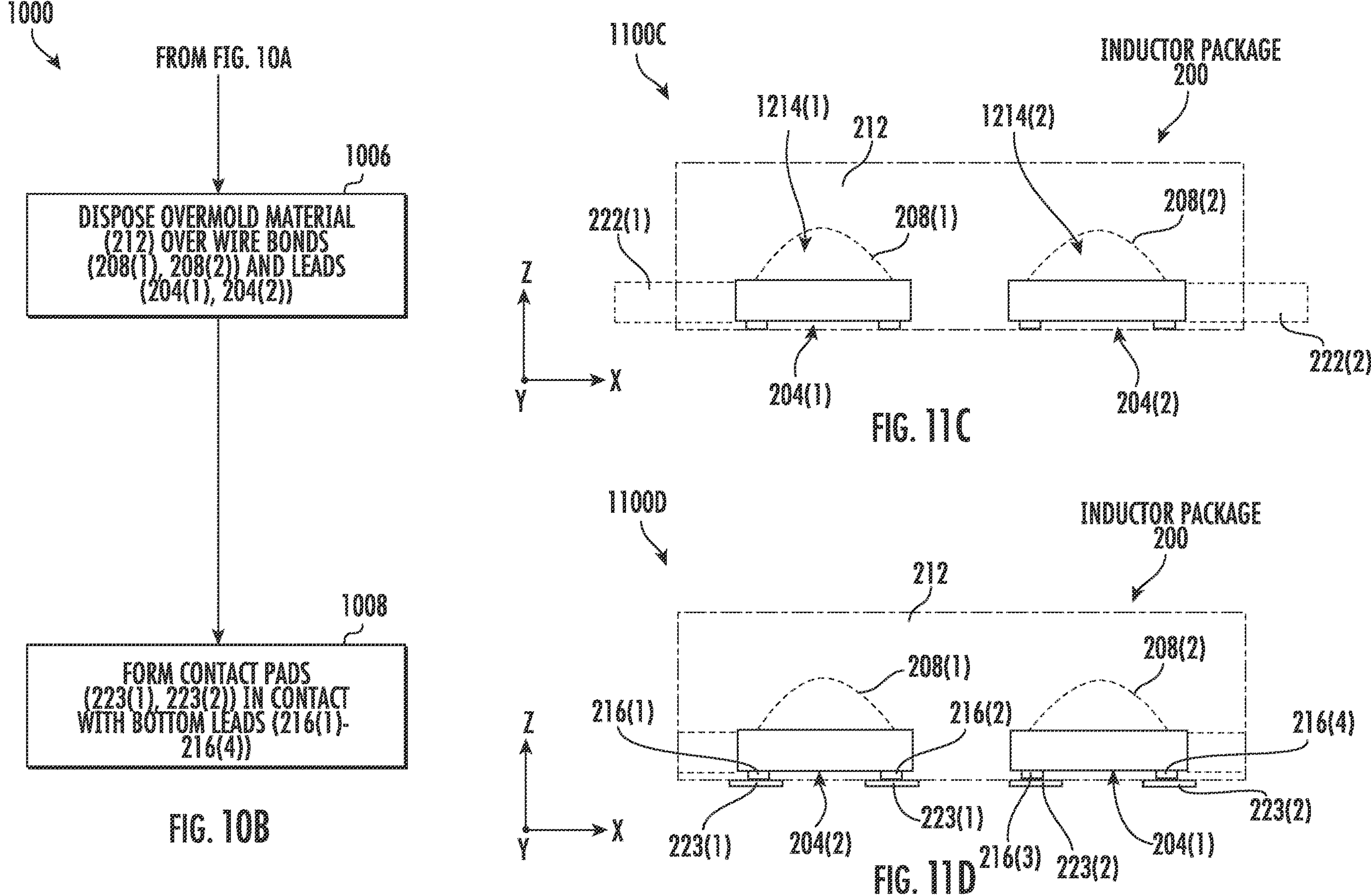

Other fabrication processes can also be employed to inductor packages that include one or more integrated inductors each formed from leads in a lead frame coupled together through wire bonds to form respective coils, including but not limited to the inductor packages 200, 400, 600, 800 in FIGS. 2A-2E, 4, 6, and 8. In this regard, FIGS. 10A and 10B is a flowchart illustrating another exemplary fabrication process 1000 of fabricating an inductor package that include one or more integrated inductors each formed from leads in a lead frame coupled together through wire bonds to form respective coils, including but not limited to the inductor packages 200, 400, 600, 800 in FIGS. 2A-2E, 4, 6, and 8. FIGS. 11A and 11B are exemplary fabrication stages 1100A-1100D during fabrication of the inductor package according to the fabrication process 1000 in FIGS. 10A and 10B. The fabrication process 1000 in FIGS. 10A and 10B, and as shown in the fabrication stages 1100A-1100H in FIGS. 11A-11D, are discussed in reference to the inductor package 200 in FIGS. 2A-2E, but note that such is not limiting.

In this regard, as shown in the fabrication stage 1100A in FIG. 11A, a first step in fabricating the inductor package 200 is forming the lead frame 206 and patterning, etching, or stripping the lead frame 206 to form the first and second leads 204(1), 204(2) with their bottom leads 216(1)-216(4) and first and second top leads 218(1), 218(2) (block 1002 in FIG. 10A). First and second tail portions 222(1), 222(2) of the formed first and second leads 204(1), 204(2) are also formed, but not shown in sold lines in FIG. 11A since the view of the first and second leads 204(1), 204(2) in FIG. 11A is a cross-sectional view across a portion of the first and second top leads 218(1), 218(2) that does not include the first and second tail portions 222(1), 222(2). Then, as shown in the fabrication stage 1100B in FIG. 11B, a next step fabricating the inductor package 200 is bonding wires as first and second wire bonds 208(1), 208(2) to adjacent first and second leads 204(1), 204(2) (block 1004 in FIG. 10A).

Figures 12A, 12B:
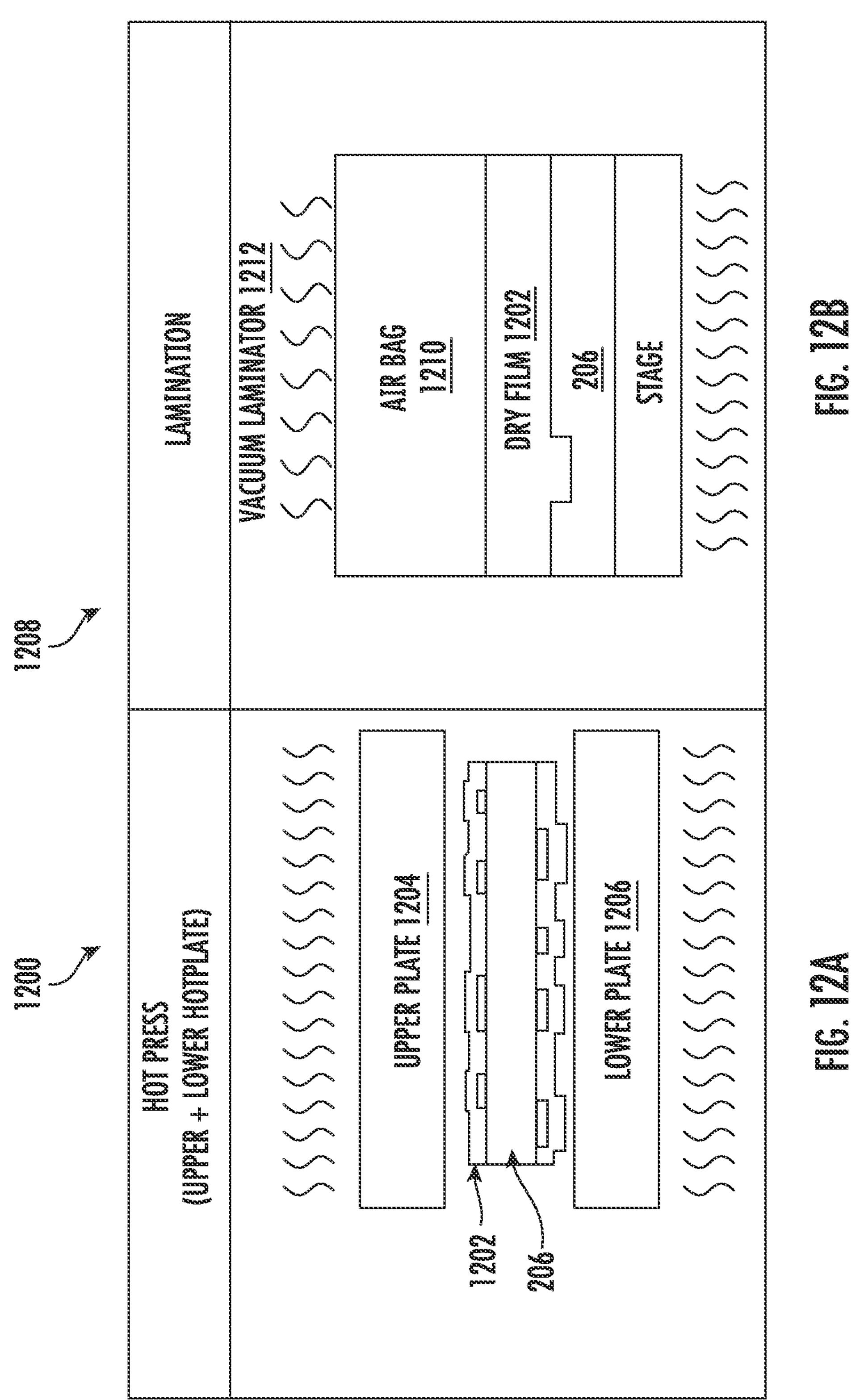
FIGS. 12A and 12B are diagrams illustrating exemplary processes for disposing magnetic material sheets over a lead frame and wire bond coupled together to form a coil(s) for an integrated inductor(s), to provide an overmold material to form an inductor package for the integrated inductor(s)

Then, as shown in the fabrication stage 1100C in FIG. 11C, a next step fabricating the inductor package 200 is disposing the overmold material 212 over the first and second wire bonds 208(1), 208(1) and first and second leads 204(1), 204(2) to form the inductor package 200 (block 1006 in FIG. 10B). This can be performed by various processes. For example, the overmold material 212 can be disposed over the first and second wire bonds 208(1), 208(2) and first and second leads 204(1), 204(2) using a hot press method as shown in the process 1200 in FIG. 12A. The overmold material 212 can be provided as a dry film 1202 that is laid over the first and second wire bonds 208(1), 208(2) and first and second leads 204(1), 204(2). The inductor package 200 can then be brought in between an upper plate 1204 and a lower plate 1206 that are heated (e.g., to 180 degrees Celsius) and a force applied (e.g., 21 Kgf/cm$^2$). This will cause the dry film 1202 to soften or melt and form over the first and second wire bonds 208(1), 208(2) and first and second leads 204(1), 204(2) and inside the void spaces 214(1), 214(2) as shown in FIG. 11C. In another example, the overmold material 212 can be disposed over the first and second wire bonds 208(1), 208(1) and first and second leads 204(1), 204(2) using a lamination method as shown in the process 1208 in FIG. 12B. The overmold material 212 can be provided as a dry film 1202 that is laid over the first and second wire bonds 208(1), 208(2) and first and second leads 204(1), 204(2). The inductor package 200 can then be brought in contact with an air bag 1210 whose inflation is controlled by a vacuum laminator 1212 to cause the air bag 1210 to laminate the dry film 1202 over the first and second wire bonds 208(1), 208(2) and first and second leads 204(1), 204(2). The lead frame 206 may also be heated when the force is applied to laminate the dry film 1202 to soften the dry film 1202.

Then, as shown in the fabrication stage 1100D in FIG. 11D, a next optional step fabricating the inductor package 200 is forming the first and second contact pads 223(1), 223(2) in contact with the bottom leads 216(1)-216(4) to provide an external connection to the first and second leads 204(1), 204(2) in the encased by the overmold material 212 in the inductor package 200 (block 1008 in FIG. 10B).

Note that the term "outer" is a relative term and not necessarily limited to a component described as a "top" or "bottom" component being above or below another component. Also note that a component described as "mounted," "coupled," and "disposed on" herein is not limited to such component being directly or indirectly attached or coupled.

An integrated inductor that includes one or more inductor packages that each can be integrated into an IC package, and wherein each inductor package includes one or more integrated inductors each formed from leads in a lead frame coupled together through wire bonds to form respective coils, including but not limited to the inductor packages in FIGS. 2A-2E, 4, 6, 8, and 11A-11D, and fabricated according to a fabrication process, including but not limited to the exemplary fabrication processes in FIGS. 9-10B and 12A-12B, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 13:
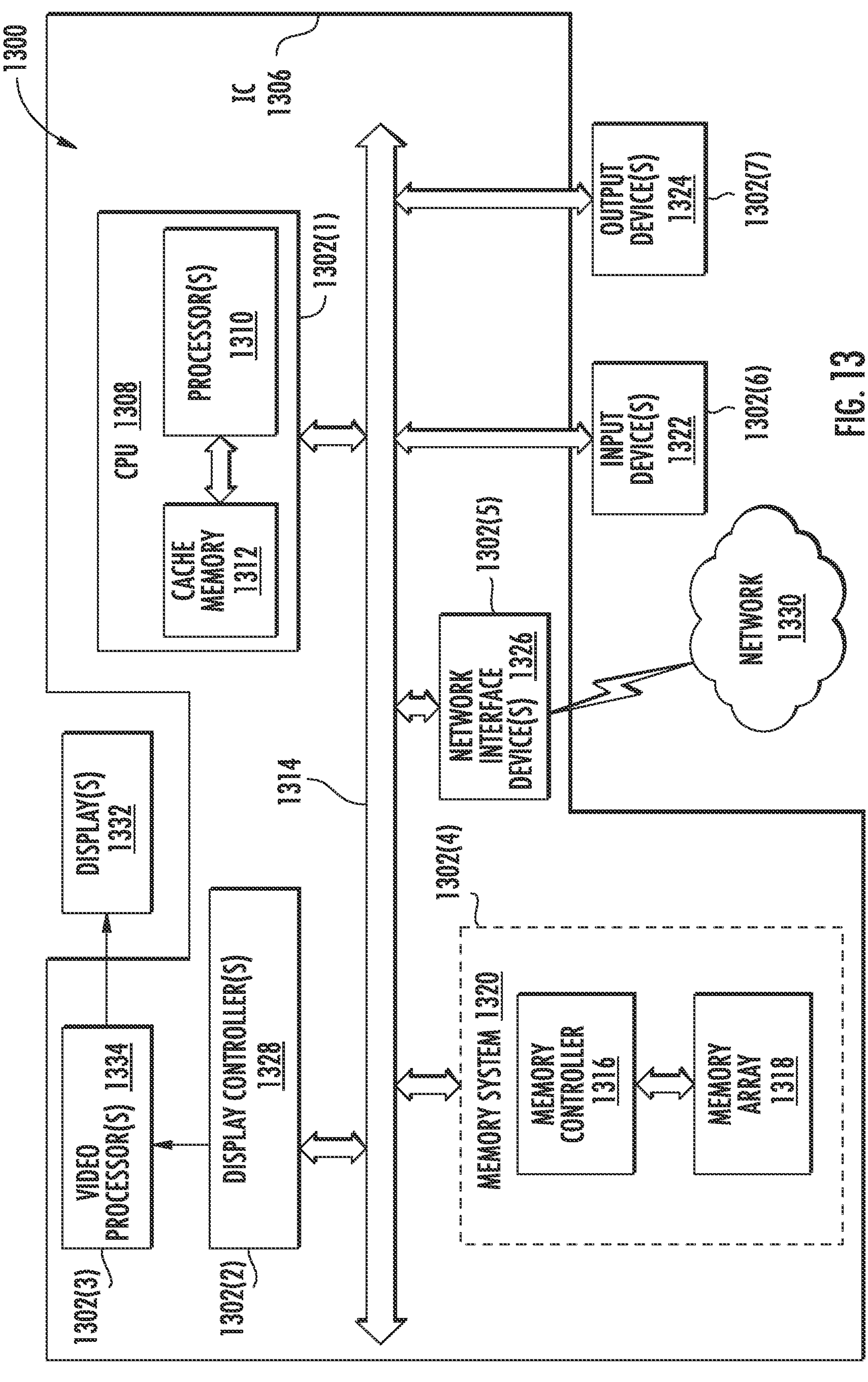
FIG. 13 is a block diagram of an exemplary processor-based system that can include components that can include one or more inductor packages that can be integrated into an IC package, wherein the inductor packages each include one or more integrated inductors each formed from leads in a lead frame coupled together through extended top leads and wire bonds to form respective coils, including but not limited to the integrated inductors in FIGS. 2A-2E, 4, 6, 8, and 11A-111D, and fabricated according to a fabrication process, including but not limited to the exemplary fabrication processes in FIGS. 9-10B and 12A-12B.

In this regard, FIG. 13 illustrates an example of a processor-based system 1300 that can include one or more inductor packages 1302(1)-1302(7) that each can be integrated into an IC package, and wherein each inductor package 1302(1)-1302(7) includes one or more integrated inductors each formed from leads in a lead frame coupled together through wire bonds to form respective coils, including but not limited to the inductor packages in FIGS. 2A-2E, 4, 6, 8, and 11A-11D, and fabricated according to a fabrication process, including but not limited to the exemplary fabrication processes in FIGS. 9-10B and 12A-12B. For example, the inductor packages 1302(1)-1302(7) may be employed as part of a power regulation circuit. In this example, the processor-based system 1300 may be formed as an IC 1304, and as part of an IC package such as system-on-a-chip (SoC). The processor-based system 1300 includes a central processing unit (CPU) 1308 that includes one or more processors 1310, which may also be referred to as CPU cores or processor cores. The CPU 1308 may have cache memory 1312 coupled to the CPU 1308 for rapid access to temporarily stored data. The CPU 1308 is coupled to a system bus 1314 and can intercouple master and slave devices included in the processor-based system 1300. As is well known, the CPU 1308 communicates with these other devices by exchanging address, control, and data information over the system bus 1314. For example, the CPU 1308 can communicate bus transaction requests to a memory controller 1316, as an example of a slave device. Although not illustrated in FIG. 13, multiple system buses 1314 could be provided, wherein each system bus 1314 constitutes a different fabric.

Other master and slave devices can be connected to the system bus 1314. As illustrated in FIG. 13, these devices can include a memory system 1320 that includes the memory controller 1316 and a memory array(s) 1318, one or more input devices 1322, one or more output devices 1324, one or more network interface devices 1326, and one or more display controllers 1328, as examples. The input device(s) 1322 can include any type of input device, including, but not limited to, input keys, switches, voice processors, etc. The output device(s) 1324 can include any type of output device, including, but not limited to, audio, video, other visual indicators, etc. The network interface device(s) 1326 can be any device configured to allow exchange of data to and from a network 1330. The network 1330 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1326 can be configured to support any type of communications protocol desired.

The CPU 1308 may also be configured to access the display controller(s) 1328 over the system bus 1314 to control information sent to one or more displays 1332. The display controller(s) 1328 sends information to the display(s) 1332 to be displayed via one or more video processor(s) 1334, which process the information to be displayed into a format suitable for the display(s) 1332. The display(s) 1332 can include any type of display, including, but not limited to, a cathode ray tube (CRT), a liquid crystal display (LCD), a plasma display, a light emitting diode (LED) display, etc.

Figure 14:
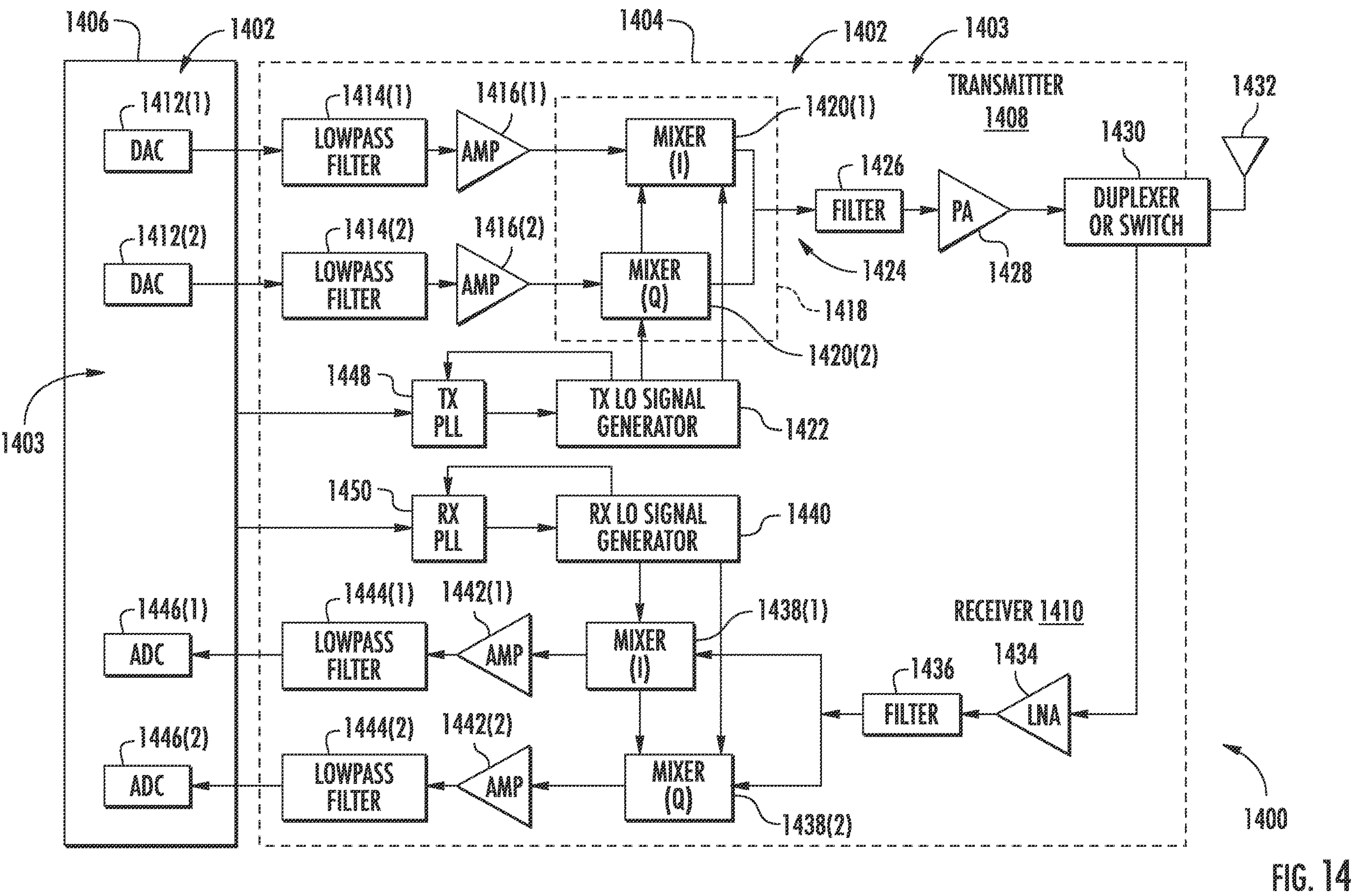
FIG. 14 is a block diagram of an exemplary wireless communication device that includes radio-frequency (RF) components that can include one or more inductor packages that can be integrated into an IC package, wherein the inductor packages each include one or more integrated inductors each formed from leads in a lead frame coupled together through extended top leads and wire bonds to form respective coils, including but not limited to the integrated inductors in FIGS. 2A-2E, 4, 6, 8, and 11A-11D, and fabricated according to a fabrication process, including but not limited to the exemplary fabrication processes in FIGS. 9-10B and 12A-12B.

FIG. 14 illustrates an exemplary wireless communications device 1400 that includes radio-frequency (RF) components formed from one or more ICs 1402, wherein any of the ICs 1402 can include one or more inductor packages 1403 that can each be integrated into an IC package, and wherein the inductor packages 1403 each include one or more integrated inductors each formed from leads in a lead frame coupled together through wire bonds to form respective coils, including but not limited to the inductor packages in FIGS. 2A-2E, 4, 6, 8, and 11A-11D, and fabricated according to a fabrication process, including but not limited to the exemplary fabrication processes in FIGS. 9-10B and 12A-12B. The wireless communications device 1400 may include or be provided in any of the above-referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RF ICs (RFICs), mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage, and then from IF to baseband in another stage for the receiver 1410. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog converters (DACs) 1412(1), 1412(2) for converting digital signals generated by the data processor 1406 into the I and Q analog output signals (e.g., I and Q output currents) for further processing.

Within the transmitter 1408, lowpass filters 1414(1), 1414(2) filter the I and Q analog output signals, respectively, to remove undesired signals caused by the prior digital-to-analog conversion. Amplifiers (AMPs) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals through mixers 1420(1), 1420(2) from a TX LO signal generator 1422 to provide an upconverted signal 1424. A filter 1426 filters the upconverted signal 1424 to remove undesired signals caused by the frequency up-conversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Down-conversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by AMPs 1442(1), 1442(2) and further filtered by lowpass filters 1444(1), 1444(2) to obtain I and Q analog input signals, which are provided to the data processor 1406. In this example, the data processor 1406 includes analog-to-digital converters (ADCs) 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency up-conversion, while the RX LO signal generator 1440 generates the I and Q RX LO signals used for frequency down-conversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An inductor package, comprising:
   a lead frame, comprising:
      a plurality of leads,
      each lead of the plurality of leads adjacent to another lead of the plurality of leads; and
   an inductor comprising a conductive coil, comprising:
      the plurality of leads; and
      one or more wire bonds each coupled to at least two (2) leads of the plurality of leads.
2. The inductor package of clause 1, wherein the conductive coil comprises a three-dimensional (3D) conductive coil.
3. The inductor package of clause 1, wherein:
   each lead of the plurality of leads are disposed in a first plane; and
   the one or more wire bonds extend in a second direction orthogonal to the first plane.
4. The inductor package of any of clauses 1 to 3, wherein:
   each lead of the plurality of leads has a first width in a first direction; and
   each lead of the plurality of leads comprises a tail portion having a second width less than the first width in the first direction.
5. The inductor package of clause 4, further comprising a plurality of sides;
   wherein the tail portion of each lead of the plurality of leads extends to a side of the plurality of sides of the inductor package.
6. The inductor package of clause 5, wherein the tail portion of each lead of the plurality of leads comprises an end portion co-planar to the side of the plurality of sides of the inductor package.
7. The inductor package of any of clauses 1 to 3, wherein each lead of the plurality of leads does not comprise a tail portion.
8. The inductor package of any of clauses 1 to 7, wherein:
   the lead frame further comprises:
      a plurality of second leads,
      each second lead of the plurality of second leads adjacent to another second lead of the plurality of second leads; and
   further comprising:
      a second inductor comprising a second conductive coil, comprising:
         the plurality of second leads; and
         one or more second wire bonds each coupled to at least two (2) second leads of the plurality of second leads.
9. The inductor package of clause 8, wherein:
   each lead of the plurality of leads has a first width in a first direction;
   each lead of the plurality of leads comprises a tail portion of a plurality of tail portions each having a second width less than the first width in the first direction;

each second lead of the plurality of second leads has a third width in a third direction; and each second lead of the plurality of second leads comprises a second tail portion of a plurality of second tail portions each having a fourth width less than the third width in the third direction.

10. The inductor package of clause 9, wherein:

the plurality of tail portions each extend along a first longitudinal axis in a fifth direction; and the plurality of second tail portions each extend along a second longitudinal axis in the fifth direction.

11. The inductor package of clause 9, wherein:

the plurality of tail portions each extend along a first longitudinal axis in a fifth direction; and the plurality of second tail portions each extend along a second longitudinal axis in a sixth direction orthogonal to the fifth direction.

12. The inductor package of any of clauses 1 to 11, wherein:

each lead of the plurality of leads comprises a first end portion and a second end portion adjacent to each other in a first direction;

each first end portion of each lead of the plurality of leads adjacent to each other in a second direction orthogonal to the first direction;

each second end portion of each lead of the plurality of leads adjacent to each other in the second direction; and the one or more wire bonds each coupled to a second end portion of a first lead of the plurality of leads and to a first end portion of a second lead of the plurality of leads.

13. The inductor package of any of clauses 1 to 12, wherein each lead of the plurality of leads comprises:

a first bottom lead;

a second bottom lead; and a top lead extending from the first bottom lead to the second bottom lead, and coupled to the first bottom lead and the second bottom lead.

14. The inductor package of clause 13, wherein:

the first bottom lead of each of the plurality of leads is disposed along a first longitudinal axis in a first lead column;

the second bottom lead of each of the plurality of leads is disposed along a second longitudinal axis parallel to the first longitudinal axis and in a second lead column;

the first bottom lead and the second bottom lead of each of the plurality of leads disposed along a third longitudinal axis orthogonal to the first longitudinal axis and in a lead row of a plurality of lead rows;

each second bottom lead of the plurality of leads in a respective lead row of the plurality of lead rows, coupled by a wire bond of the one or more wire bonds to a first bottom lead of the plurality of leads in the respective lead row.

15. The inductor package of any of clauses 1 to 14, further comprising an overmold material disposed on the lead frame and the inductor.

16. The inductor package of clause 15, wherein the overmold material comprises a magnetic material.

17. The inductor package of clause 16, wherein:

the conductive coil comprises a void space between the one or more wire bonds and the plurality of leads; and the magnetic material is further disposed in the void space of the conductive coil.

18. The inductor package of clause 8, further comprising an overmold material disposed on the lead frame, the inductor, and the second inductor.

19. The inductor package of any of clauses 1 to 18 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

20. A method of fabricating an inductor package, comprising:

providing a lead frame, wherein the lead frame comprises:

a plurality of leads, each lead of the plurality of leads adjacent to another lead of the plurality of leads; and forming a conductive coil, comprising:

coupling each wire bond of one or more wire bonds to at least two (2) leads of the plurality of leads.

21. The method of clause 20, further comprising disposing an overmold material on the lead frame and the conductive coil.

22. The method of clause 20, further comprising disposing an overmold material comprising a magnetic overmold material on the lead frame and the conductive coil.

23. The method of clause 22, further comprising disposing the magnetic overmold material in an internal void space of the conductive coil.

24. The method of any of clauses 20 to 23, further comprising removing a tail portion of each of the plurality of leads at a side of the inductor package formed from the overmold material;

wherein the tail portion of each lead of the plurality of leads extends to a side of a plurality of sides of the inductor package.

25. The method of any of clauses 20 to 24, wherein:

the lead frame further comprises:

a plurality of second leads, each second lead of the plurality of second leads adjacent to another second lead of the plurality of second leads; and further comprising:

forming a second conductive coil, comprising:

coupling each second wire bond of one or more second wire bonds to at least two (2) second leads of the plurality of second leads.

26. The method of any of clauses 20 to 25, wherein:

each lead of the plurality of leads comprises a first end portion and a second end portion adjacent to each other in a first direction;

each first end portion of each lead of the plurality of leads adjacent to each other in a second direction orthogonal to the first direction;

each second end portion of each lead of the plurality of leads adjacent to each other in the second direction; and comprising coupling each wire bond of the one or more wire bonds to a second end portion of a first lead of the plurality of leads and to a first end portion of a second lead of the plurality of leads.

27. The method of clause 21, wherein disposing the overmold material on the lead frame and the inductor package comprises applying a heated plate to the overmold material comprising an overmold material layer to dispose the overmold material layer on the lead frame and the conductive coil.

28. The method of clause 21, wherein disposing the overmold material on the lead frame and the inductor comprises:

heating the overmold material comprising an overmold material layer; and laminating the heated overmold material layer on the lead frame and the conductive coil.

29. An integrated circuit (IC) package, comprising:

a package substrate comprising a first surface and one or more first metallization layers each comprising one or more first metal interconnects;

a die coupled to the first surface of the package substrate, the die coupled to at least one first metal interconnect of the one or more metal interconnects;

and a power management die coupled to the package substrate, the power management die coupled to the at least one first metal interconnect coupled to the die and coupled to at least one second metal interconnect of the one or more metal interconnects; and an inductor package coupled to the package substrate and coupled to the at least one second metal interconnect coupled to the power management die, the inductor package comprising:

a lead frame, comprising:

a plurality of leads, each lead of the plurality of leads adjacent to another lead of the plurality of leads; and an inductor comprising a conductive coil coupled to the at least one second metal interconnect, the conductive coil, comprising:

the plurality of leads; and one or more wire bonds each coupled to at least two (2) leads of the plurality of leads.

30. The IC package of clause 29, wherein the power management die is configured to distribute a power signal to the at least one first metal interconnect.

31. The IC package of clause 29 or 30, wherein the conductive coil comprises a three-dimensional (3D) conductive coil.

32. The IC package of any of clauses 29 to 31, wherein:

the lead frame further comprises:

a plurality of second leads, each second lead of the plurality of second leads adjacent to another second lead of the plurality of second leads; and the inductor package further comprises:

a second inductor comprising a second conductive coil, comprising:

the plurality of second leads; and one or more second wire bonds each coupled to at least two (2) second leads of the plurality of second leads.

33. The IC package of any of clauses 29 to 32, wherein the inductor package further comprises an overmold material disposed on the lead frame and the inductor.

34. The IC package of clause 33, wherein the overmold material comprises a magnetic overmold material.

35. The IC package of clause 34, wherein:

the conductive coil comprises an internal void space; and the magnetic overmold material is further disposed in the internal void space of the conductive coil.

What is claimed is:

1. An inductor package, comprising:

a lead frame, comprising:

a metal frame structure comprising:

a plurality of leads each comprising a tail portion extending in a second direction, each lead of the plurality of leads adjacent to another lead of the plurality of leads;

a plurality of second leads each comprising a second tail portion extending in the second direction, each second lead of the plurality of second leads adjacent to another second lead of the plurality of second leads; and a plurality of third leads between the plurality of leads and the plurality of second leads in the second direction, each third lead of the plurality of third leads comprising a third tail portion extending at least partially in a first direction orthogonal to the second direction; and each third lead of the plurality of third leads adjacent to another third lead of the plurality of third leads;

an inductor comprising a conductive coil, comprising:

the plurality of leads; and one or more wire bonds each coupled to at least two (2) leads of the plurality of leads;

a second inductor comprising a second conductive coil, comprising:

the plurality of second leads; and one or more second wire bonds each coupled to at least two (2) second leads of the plurality of second leads; and a third inductor comprising a third conductive coil between the inductor and the second inductor in the second direction, comprising:

the plurality of third leads; and one or more third wire bonds each coupled to at least two (2) third leads of the plurality of third leads.

2. The inductor package of claim 1, wherein the conductive coil comprises a three-dimensional (3D) conductive coil.

3. The inductor package of claim 1, wherein:

each lead of the plurality of leads is disposed in a first plane; and the one or more wire bonds extend in the second direction orthogonal to the first plane.

4. The inductor package of claim 1, wherein:

each lead of the plurality of leads has a first width in the first direction; and each lead of the plurality of leads comprises the tail portion having a second width less than the first width in the first direction.

5. The inductor package of claim 4, further comprising a plurality of sides;

wherein the tail portion of each lead of the plurality of leads extends to a side of the plurality of sides of the inductor package.

6. The inductor package of claim 5, wherein the tail portion of each lead of the plurality of leads comprises an end portion co-planar to the side of the plurality of sides of the inductor package.

7. The inductor package of claim 1, wherein:

each lead of the plurality of leads has a first width in the first direction;

the plurality of tail portions each have a second width less than a first width in the first direction;

each second lead of the plurality of second leads has a third width in the first direction; and the plurality of second tail portions each have a fourth width less than the third width in the first direction;

each third lead of the plurality of third leads has a fifth width in the first direction;

the plurality of third tail portions each have a sixth width less than the fifth width in the first direction.

8. The inductor package of claim 7, wherein:

the plurality of tail portions each extend along a first longitudinal axis in the second direction;

the plurality of second tail portions each extend along a second longitudinal axis in the second direction; and the plurality of third tail portions each extend along a third longitudinal axis at least partially in the first direction.

9. The inductor package of claim 1, wherein:

each lead of the plurality of leads comprises a first end portion and a second end portion adjacent to each other in a first direction;

each first end portion of each lead of the plurality of leads adjacent to each other in a second direction orthogonal to the first direction;

each second end portion of each lead of the plurality of leads adjacent to each other in the second direction; and the one or more wire bonds each coupled to a second end portion of a first lead of the plurality of leads and to a first end portion of a second lead of the plurality of leads.

10. The inductor package of claim 1, wherein each lead of the plurality of leads comprises:

a first bottom lead;

a second bottom lead; and a top lead extending from the first bottom lead to the second bottom lead, and coupled to the first bottom lead and the second bottom lead.

11. The inductor package of claim 10, wherein:

the first bottom lead of each of the plurality of leads is disposed along a first longitudinal axis in a first lead column;

the second bottom lead of each of the plurality of leads is disposed along a second longitudinal axis parallel to the first longitudinal axis and in a second lead column;

the first bottom lead and the second bottom lead of each of the plurality of leads disposed along a third longitudinal axis orthogonal to the first longitudinal axis and in a lead row of a plurality of lead rows;

each second bottom lead of the plurality of leads in a respective lead row of the plurality of lead rows, coupled by a wire bond of the one or more wire bonds to a first bottom lead of the plurality of leads in the respective lead row.

12. The inductor package of claim 1, further comprising an overmold material disposed on the lead frame and the inductor, the second inductor, and the third inductor.

13. The inductor package of claim 12, wherein the overmold material comprises a magnetic material.

14. The inductor package of claim 13, wherein:

the conductive coil comprises a void space between the one or more wire bonds and the plurality of leads;

the second conductive coil comprises a second void space between the one or more second wire bonds and the plurality of second leads;

the third conductive coil comprises a third void space between the one or more third wire bonds and the plurality of third leads; and the magnetic material is further disposed in the void space of the conductive coil, the second conductive coil, and the third conductive coil.

15. The inductor package of claim 1, further comprising an overmold material disposed on the lead frame, the inductor, the second inductor, and the third inductor.

16. The inductor package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A method of fabricating an inductor package, comprising:

providing a lead frame, wherein the lead frame comprises:

a metal frame structure comprising:

a plurality of leads each comprising a tail portion extending in a second direction, each lead of the plurality of leads adjacent to another lead of the plurality of leads; and a plurality of second leads each comprising a second tail portion extending in the second direction, each second lead of the plurality of second leads adjacent to another second lead of the plurality of second leads; and a plurality of third leads between the plurality of leads and the plurality of second leads in the second direction, each third lead of the plurality of third leads comprising third tail portion extending at least partially in a first direction orthogonal to the second direction; and each third lead of the plurality of third leads adjacent to another third lead of the plurality of third leads; and forming a conductive coil, comprising:

coupling each wire bond of one or more wire bonds to at least two (2) leads of the plurality of leads to form a first inductor;

forming a second conductive coil, comprising:

coupling each second wire bond of one or more second wire bonds to at least two (2) second leads of the plurality of second leads to form a second inductor; and forming a third conductive coil between the inductor and the second inductor in the second direction, comprising:

coupling each third wire bond of one or more second third bonds to at least two (2) third leads of the plurality of third leads to form a third inductor.

18. The method of claim 17, further comprising disposing an overmold material on the lead frame, the conductive coil, the second conductive coil, and the third conductive coil.

19. The method of claim 18, wherein disposing the overmold material on the lead frame and the inductor package comprises applying a heated plate to the overmold material comprising an overmold material layer to dispose the overmold material layer on the lead frame, the conductive coil, the second conductive coil, and the third conductive coil.

20. The method of claim 18, wherein disposing the overmold material on the lead frame and the inductor comprises:

heating the overmold material comprising an overmold material layer; and laminating the heated overmold material layer on the lead frame, the conductive coil, the second conductive coil, and the third conductive coil.

21. The method of claim 17, further comprising disposing an overmold material comprising a magnetic overmold material on the lead frame, and the conductive coil, the second conductive coil, and the third conductive coil.

22. The method of claim 21, further comprising disposing the magnetic overmold material in an internal void space of the conductive coil, a second internal void space of the second conductive coil, and a third internal void space of the third conductive coil.

23. The method of claim 17, further comprising removing the tail portion of each of the plurality of leads at a side of the inductor package formed from the overmold material;

wherein the tail portion of each lead of the plurality of leads extends to a side of a plurality of sides of the inductor package.

24. The method of claim 17, wherein:

each lead of the plurality of leads comprises a first end portion and a second end portion adjacent to each other in a first direction;

each first end portion of each lead of the plurality of leads adjacent to each other in a second direction orthogonal to the first direction;

each second end portion of each lead of the plurality of leads adjacent to each other in the second direction; and comprising coupling each wire bond of the one or more wire bonds to a second end portion of a first lead of the plurality of leads and to a first end portion of a second lead of the plurality of leads.

25. An integrated circuit (IC) package, comprising:

a package substrate comprising a first surface and one or more first metallization layers each comprising one or more first metal interconnects;

a die coupled to the first surface of the package substrate, the die coupled to at least one first metal interconnect of the one or more metal interconnects; and a power management die coupled to the package substrate, the power management die coupled to the at least one first metal interconnect coupled to the die and coupled to at least one second metal interconnect of the one or more metal interconnects; and an inductor package coupled to the package substrate and coupled to the at least one second metal interconnect coupled to the power management die, the inductor package comprising:

a lead frame, comprising:

a metal frame structure comprising:

a plurality of leads each comprising a tail portion extending in a second direction, each lead of the plurality of leads adjacent to another lead of the plurality of leads;

a plurality of second leads each comprising a second tail portion extending in the second direction, each second lead of the plurality of second leads adjacent to another second lead of the plurality of second leads; and a plurality of third leads between the plurality of leads and the plurality of second leads in the second direction, each third lead of the plurality of third leads comprising third tail portion extending at least partially in a first direction orthogonal to the second direction; and each third lead of the plurality of third leads adjacent to another third lead of the plurality of third leads; and an inductor comprising a conductive coil, comprising:

the plurality of leads; and one or more wire bonds each coupled to at least two (2) leads of the plurality of leads;

a second inductor comprising a second conductive coil, comprising:

the plurality of second leads; and one or more second wire bonds each coupled to at least two (2) second leads of the plurality of second leads;

a third inductor comprising a third conductive coil between the inductor and the second inductor in the second direction, comprising:

the plurality of third leads; and one or more third wire bonds each coupled to at least two (2) third leads of the plurality of third leads.

26. The IC package of claim 25, wherein the power management die is configured to distribute a power signal to the at least one first metal interconnect.

27. The IC package of claim 25, wherein the conductive coil comprises a three-dimensional (3D) conductive coil.

28. The IC package of claim 25, wherein the inductor package further comprises an overmold material disposed on the lead frame, the inductor, the second inductor, and the third inductor.

29. The IC package of claim 28, wherein the overmold material comprises a magnetic overmold material.

30. The IC package of claim 29, wherein:

the conductive coil comprises an internal void space; and the magnetic overmold material is further disposed in the internal void space of the conductive coil, the second internal void space of the second conductive coil, and the third internal void space of the third conductive coil.

* * * * *